(12) United States Patent
Surthi et al.

(10) Patent No.: US 11,631,697 B2
(45) Date of Patent: Apr. 18, 2023

(54) INTEGRATED ASSEMBLIES HAVING VERTICALLY-EXTENDING CHANNEL MATERIAL WITH ALTERNATING REGIONS OF DIFFERENT DOPANT DISTRIBUTIONS, AND METHODS OF FORMING INTEGRATED ASSEMBLIES

(71) Applicant: Micron Technology, Inc., Boise, ID (US)

(72) Inventors: Shyam Surthi, Boise, ID (US); Byeung Chul Kim, Boise, ID (US); Richard J. Hill, Boise, ID (US); Francois H. Fabreguette, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/672,659

(22) Filed: Feb. 15, 2022

(65) Prior Publication Data

US 2022/0173123 A1 Jun. 2, 2022

Related U.S. Application Data

(62) Division of application No. 16/417,162, filed on May 20, 2019, now Pat. No. 11,289,501.

(51) Int. Cl.
| | | |
|---|---|---|
| *H01L 27/11582* | (2017.01) | |
| *G11C 5/06* | (2006.01) | |
| *H01L 27/11565* | (2017.01) | |
| *H01L 27/11556* | (2017.01) | |
| *H01L 27/11519* | (2017.01) | |
| *H01L 27/11524* | (2017.01) | |
| *H01L 27/1157* | (2017.01) | |

(52) U.S. Cl.
CPC ........ *H01L 27/11582* (2013.01); *G11C 5/063* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ........ H01L 27/11582; H01L 27/11519; H01L 27/11524; H01L 27/11556; H01L 27/11565; H01L 27/1157; H01L 29/40117; H01L 29/7926; G11C 5/063; G11C 16/08; G11C 16/0483; G11C 8/14
See application file for complete search history.

(56) References Cited

U.S. PATENT DOCUMENTS 8,872,256 B2 10/2014 Lee
9,576,975 B2 2/2017 Zhang
(Continued)

*Primary Examiner* — Allison Bernstein
(74) *Attorney, Agent, or Firm* — Wells St. John P.S.

(57) ABSTRACT

Some embodiments include a memory array which has a vertical stack of alternating insulative levels and wordline levels. A channel material extends vertically along the stack. The channel material includes a semiconductor composition and has first segments alternating with second segments. The first segments are adjacent the wordline levels and the second segments are adjacent the insulative levels. The first segments have a first dopant distribution and the second segments have a second dopant distribution which is different from the first dopant distribution. Some embodiments include methods of forming integrated assemblies.

18 Claims, 32 Drawing Sheets

(56) References Cited

U.S. PATENT DOCUMENTS

| | | |
|---|---|---|
| 9,960,180 B1 | 5/2018 | Zhou |
| 10,083,981 B2 * | 9/2018 | Daycock ............. H01L 29/1037 |
| 10,340,286 B2 | 7/2019 | Goda |
| 10,593,695 B1 | 3/2020 | Kim |
| 10,770,472 B2 | 9/2020 | Kim |
| 11,081,497 B2 * | 8/2021 | Surthi ............... H01L 27/11556 |
| 11,244,954 B2 * | 2/2022 | Surthi ................... H01L 29/792 |
| 2017/0243879 A1 | 8/2017 | Yu |
| 2021/0057434 A1 | 2/2021 | Surthi |
| 2021/0057436 A1 | 2/2021 | Kim |
| 2021/0057437 A1 | 2/2021 | Surthi |
| 2021/0091106 A1 | 3/2021 | Wang |

* cited by examiner

INTEGRATED ASSEMBLIES HAVING VERTICALLY-EXTENDING CHANNEL MATERIAL WITH ALTERNATING REGIONS OF DIFFERENT DOPANT DISTRIBUTIONS, AND METHODS OF FORMING INTEGRATED ASSEMBLIES

RELATED PATENT DATA

This patent resulted from divisional application of U.S. patent application Ser. No. 16/417,162, filed May 20, 2019, the disclosures of which are incorporated herein by reference.

TECHNICAL FIELD

Integrated assemblies having vertically-extending channel material with alternating regions of different dopant distributions, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and such can lead to charge migration from one memory cell to another. The charge migration may lead to data retention problems. Some embodiments include NAND architectures having breaks in the charge-trapping material in regions between memory cells; and such breaks may impede migration of charge between memory cells. In some embodiments, the channel material has a different dopant distribution adjacent segments of the charge-trapping material than adjacent the breaks between the segments. The dopant distributions may be tailored to modify performance characteristics (programming speed, data retention, etc.) of NAND memory cells of a NAND memory array. Example embodiments are described with reference to FIGS. 5-29.

Figure 1:
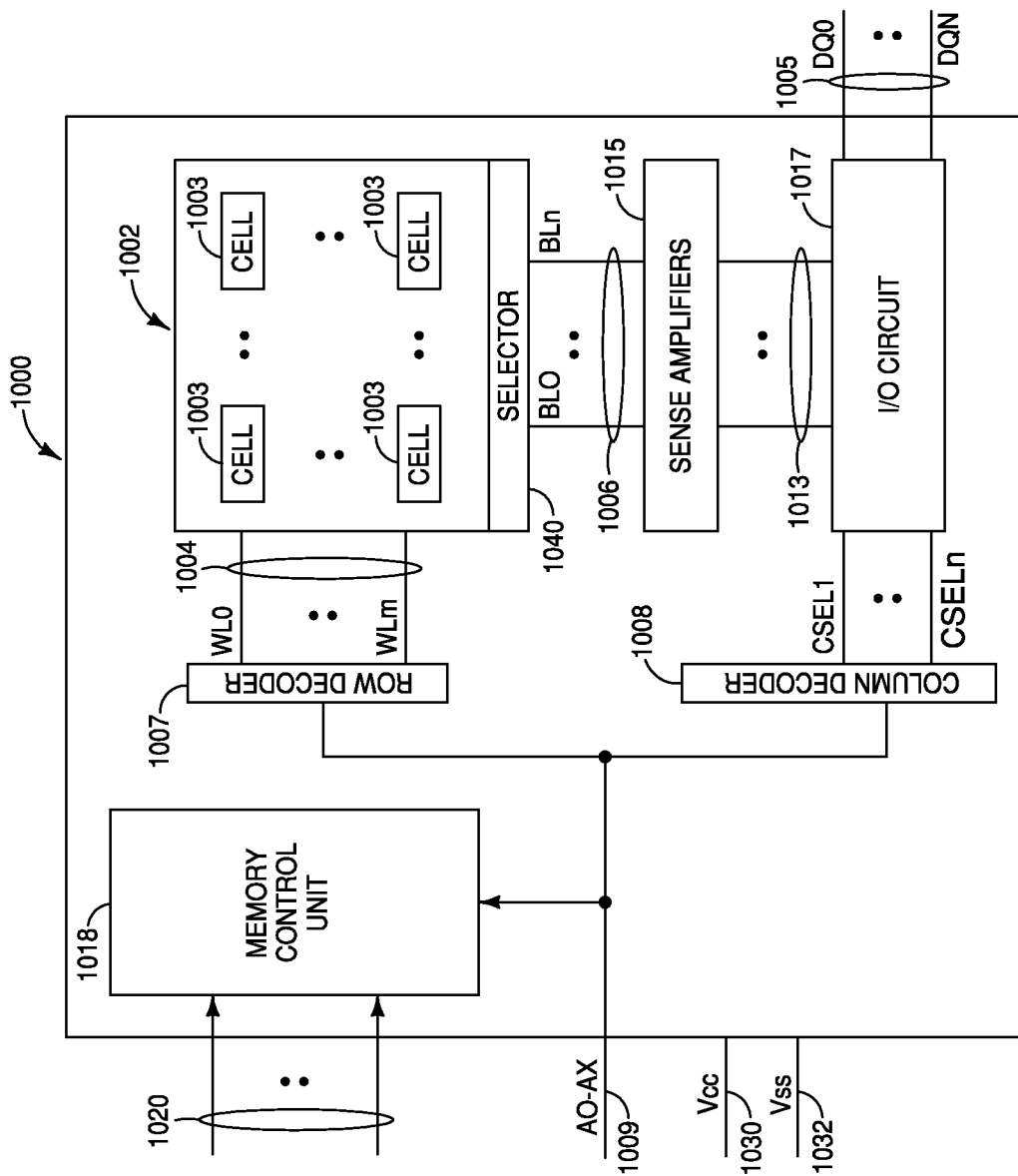
FIG. 1 shows a block diagram of a prior art memory device having a memory array with memory cells.
Figure 2:
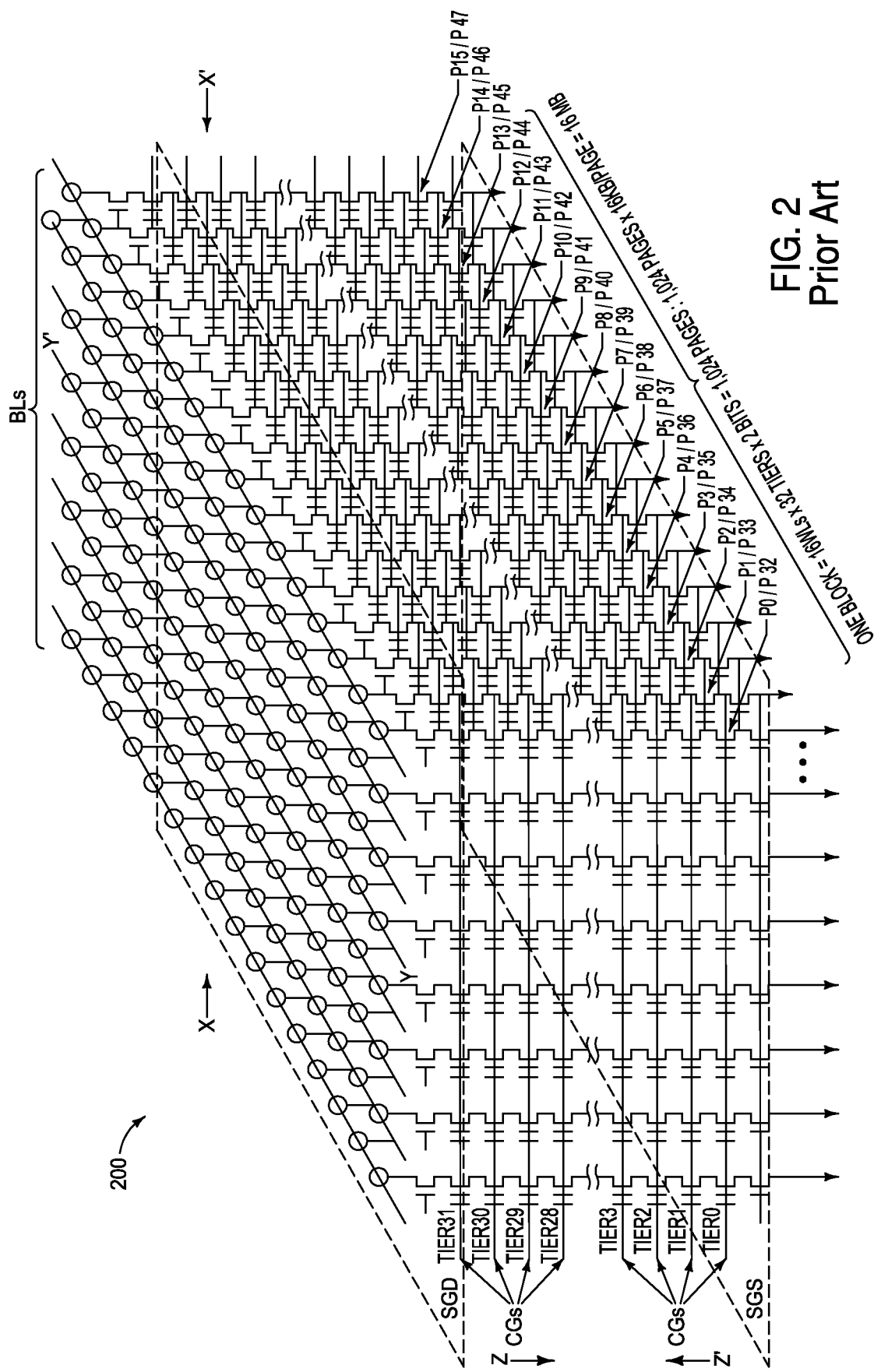
FIG. 2 shows a schematic diagram of the prior art memory array of FIG. 1 in the form of a 3D NAND memory device.
Figure 3:
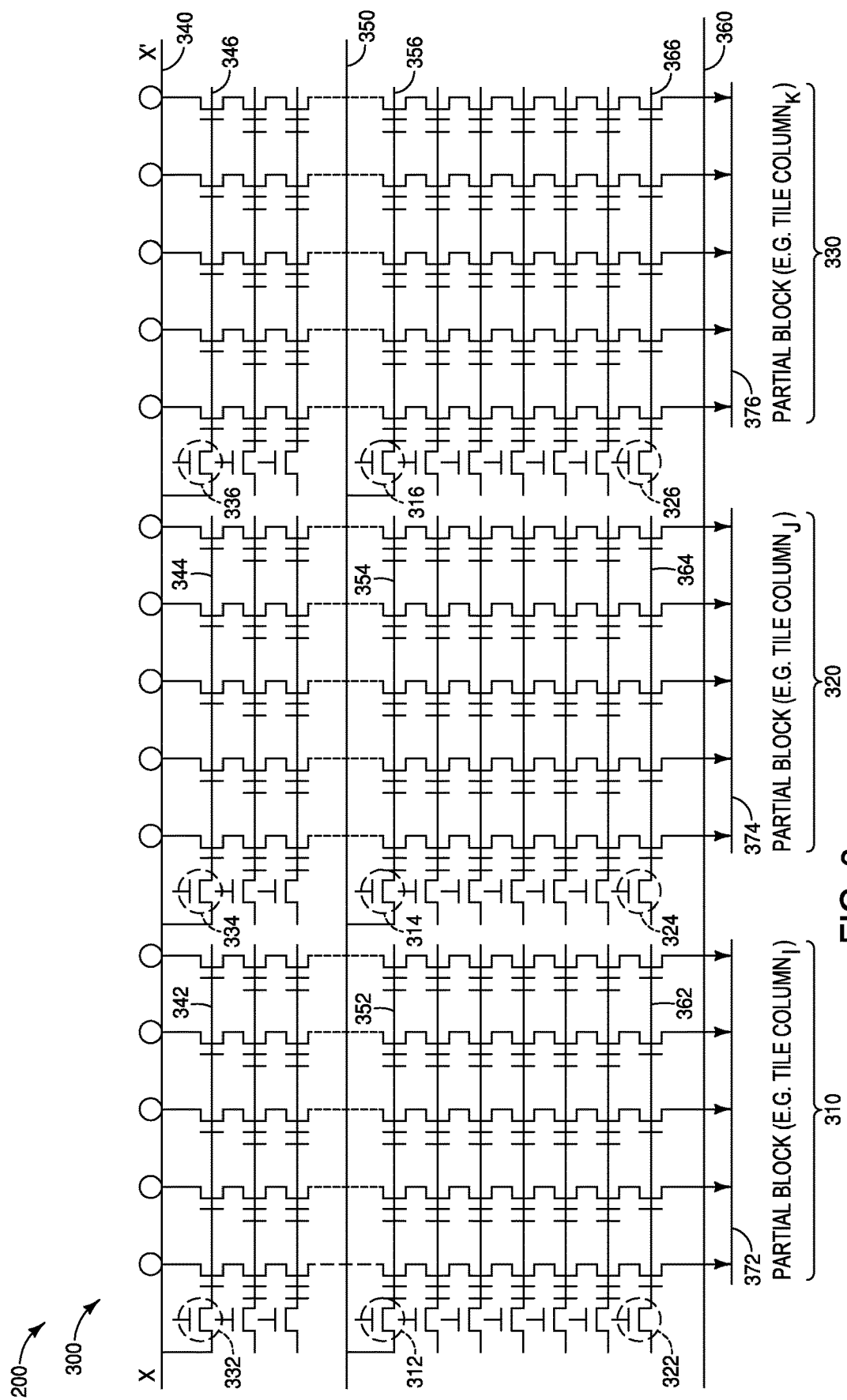
FIG. 3 shows a cross-sectional view of the prior art 3D NAND memory device of FIG. 2 in an X-X' direction.
Figure 4:
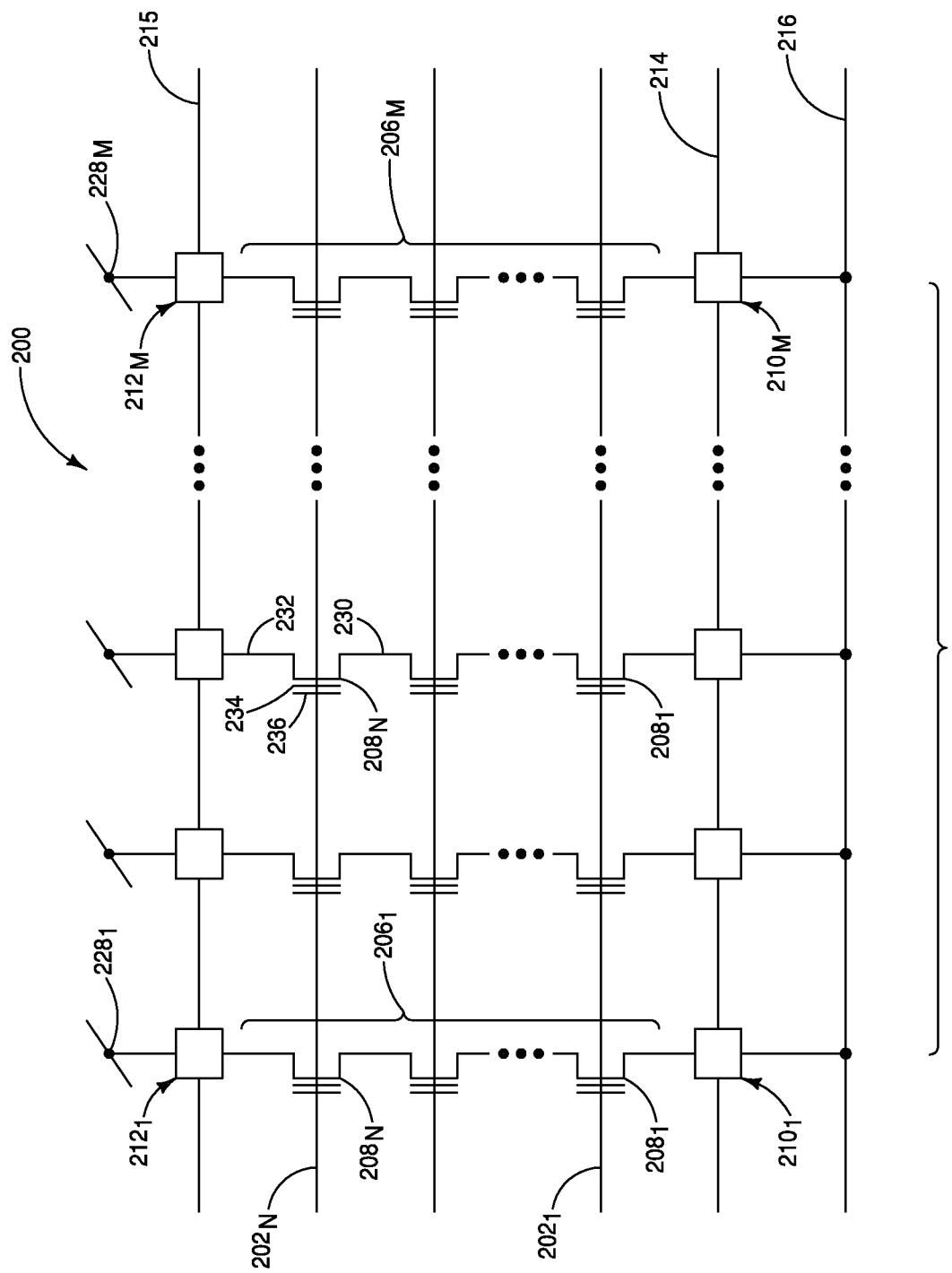
FIG. 4 is a schematic diagram of a prior art NAND memory array.
Figure 5:
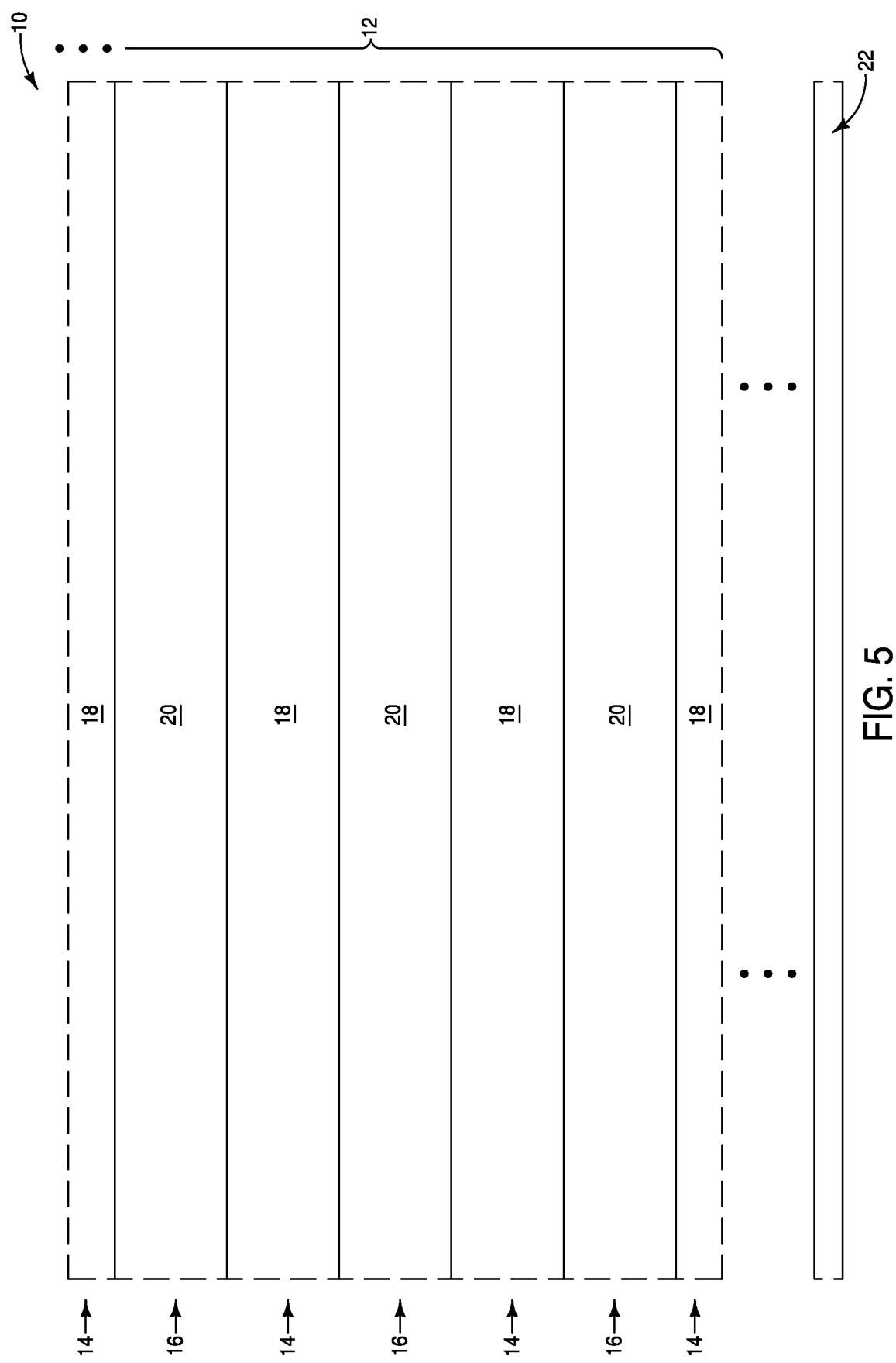
FIG. 5 is a diagrammatic cross-sectional side view of a region of an integrated assembly at an example process stage of an example method for forming an example memory array.

Referring to FIG. 5, a construction (i.e., assembly, architecture, etc.) 10 includes a vertical stack 12 of alternating first and second levels 14 and 16. The first levels 14 comprise a first material 18, and the second levels 16 comprise a second material 20. The first material 18 may comprise, for example, silicon dioxide; and the second material 20 may comprise, for example, silicon nitride. In some embodiments (described below with reference to FIGS. 12A-C), the first levels 14 may comprise two or more different materials vertically stacked one atop another.

The levels 14 and 16 may be of any suitable thicknesses; and may be the same thickness as one another, or different thicknesses relative to one another. In some embodiments, the levels 14 and 16 may have vertical thicknesses within a range of from about 10 nanometers (nm) to about 400 nm. In some embodiments, the first levels 14 may be thicker than the second levels 16. For instance, in some embodiments the first levels 14 may have thicknesses within a range of from about 20 nm to about 40 nm, and the second levels 16 may have thicknesses within a range of from about 15 nm to about 30 nm.

Some of the material 20 of the second levels 16 is ultimately replaced with conductive material of memory cell gates. Accordingly, the levels 16 may ultimately correspond to memory cell levels (also referred to herein as wordline levels) of a NAND configuration. The NAND configuration will include strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The vertical stack 12 is shown to extend upwardly beyond the illustrated region of the stack to indicate that there may be more vertically-stacked levels than those specifically illustrated in the diagram of FIG. 5.

The stack 12 is shown to be supported over a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 22 to indicate that other components and materials may be provided between the stack 12 and the base 22. Such other components and materials may comprise additional levels of the stack, a source line level, source-side select gates (SGSs), etc.

Figure 6:
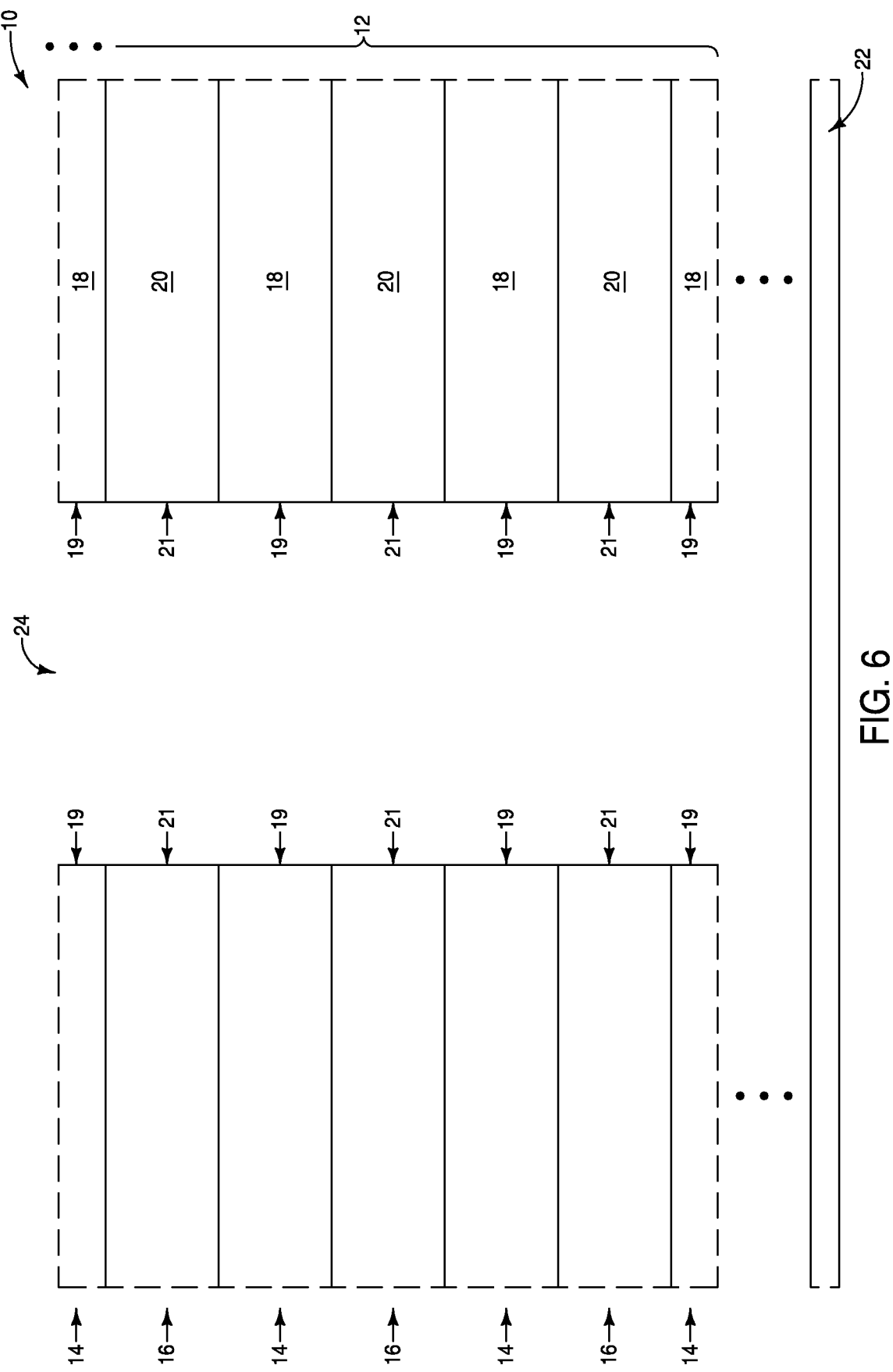
FIG. 6 is a diagrammatic cross-sectional side view of the region of the integrated assembly of FIG. 5 shown at an example process stage following that of FIG. 5.
Figure 6A:
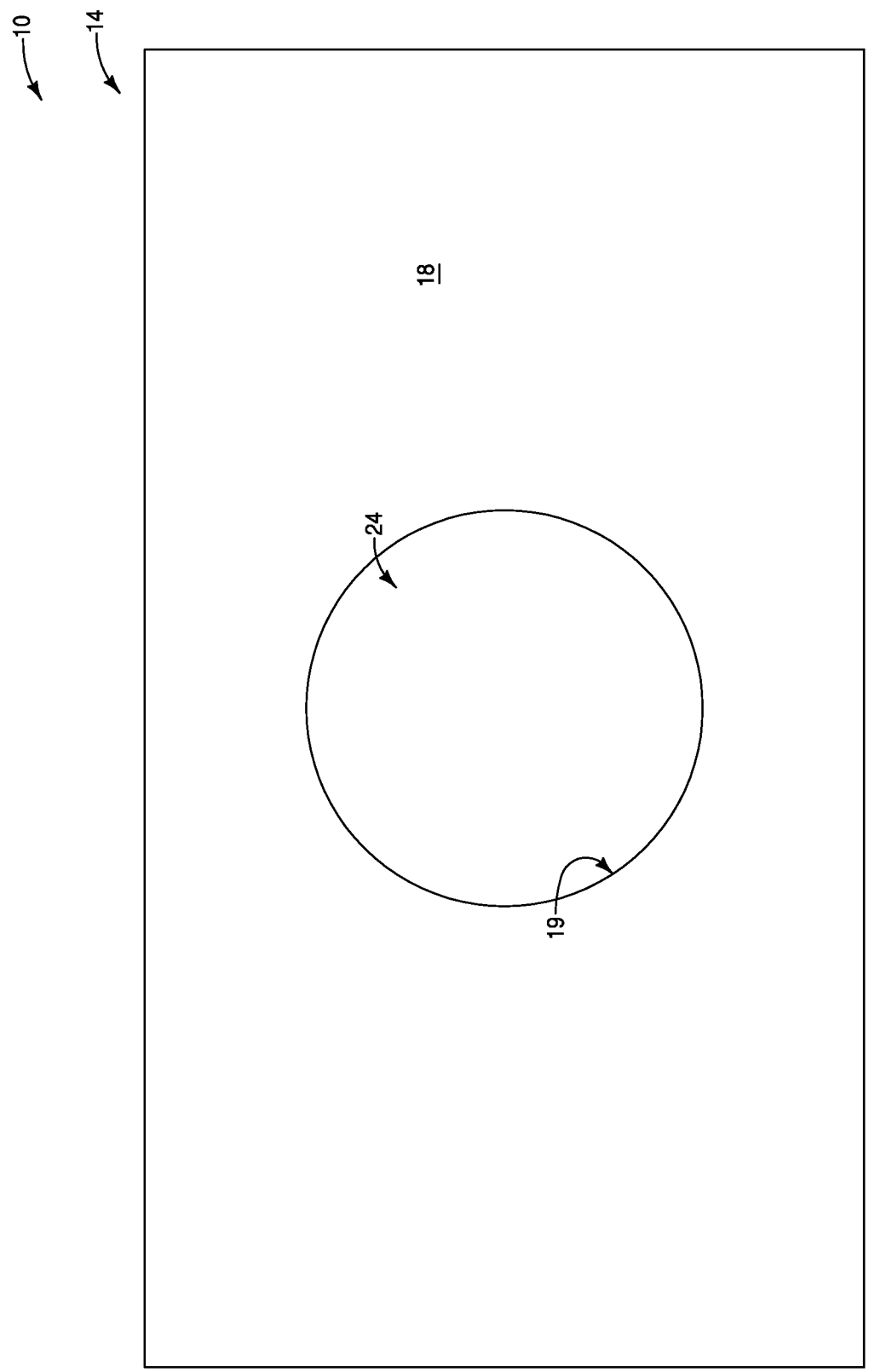
FIG. 6A is a diagrammatic top view of a portion of the integrated assembly of FIG. 6.

Referring to FIG. 6, an opening 24 is formed through the stack 12, with such opening extending through the first and second levels 14 and 16. The opening is ultimately utilized for fabricating channel material pillars associated with vertically-stacked memory cells of a memory array, and in some embodiments may be referred to as a pillar opening. The opening 24 may have any suitable configuration when viewed from above; and in some example embodiments may be circular, elliptical, polygonal, etc. FIG. 6A shows a top view of a portion of the top level 14 of the illustrated region of construction 10, and illustrates an example configuration in which the opening 24 is circular-shaped when viewed from above. The opening 24 may be representative of a large number of substantially identical openings formed through the stack 12 during fabrication of a memory array (with the term "substantially identical" meaning identical to within reasonable tolerances of fabrication and measurement).

The materials 18 and 20 have surfaces 19 and 21, respectively, which are exposed along sidewalls of the opening 24.

Figure 7:
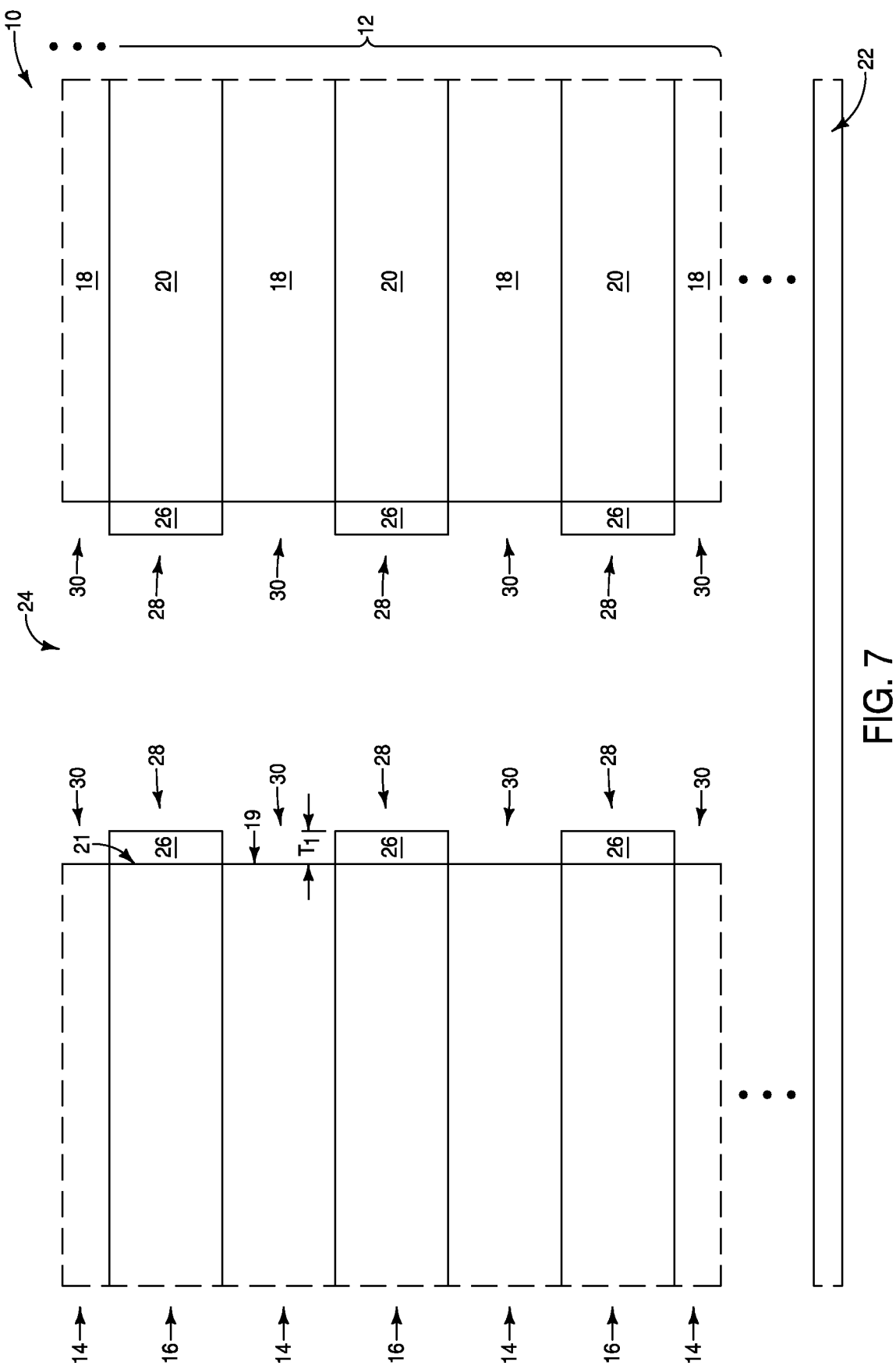
FIGS. 7-12 are diagrammatic cross-sectional side views of the region of the integrated assembly of FIG. 5 shown at example sequential process stages following the process stage of FIG. 6.

Referring to FIG. 7, a liner material 26 is formed within the opening 24 and along the second levels 16 selectively relative to the first levels 14 (i.e., selectively along the surfaces 21 of the second material 20 relative to the surfaces 19 of the first material 18). The material 26 is configured as segments (or liners) 28, with such segments (liners) being vertically spaced from one another by recesses 30. The material 26 may comprise any suitable composition(s); and in some embodiments may comprise, consist essentially of, or consist of silicon nitride.

The liner material 26 may be selectively formed along the first levels 14 relative to the second levels 16 utilizing any suitable processing. In some embodiments, a hindering material (also referred to herein as a poisoning material) may be selectively formed along the first material 18 relative to the second material 20 to preclude subsequent formation of the material 26 along surfaces of the first material 18, and then the material 26 may be formed by a suitable deposition process (e.g., atomic layer deposition, chemical vapor deposition, etc.). The hindering material may comprise any suitable composition(s); and in some embodiments may comprise one or more of N,N dimethylaminotrimethylsilane, bis(N,N-dimethylamino)dimethylsilane, ethylenediamine, 1-trimethylsilylpyrrolidine, 1-trimethylsilylpyrrole, 3,5-dimethyl-1-trimethylsilyl, and R1-(C—OH)-R2; where R1 and R2 are organic moieties.

In some embodiments, a cleaning step is utilized to treat surfaces of the insulative material 18 (e.g., silicon dioxide) prior to providing the hindering material (not shown) and forming the material 26.

In some embodiments, the liner material 26 and the second material 20 may both comprise silicon nitride. However, the liner material 26 and the second material 20 may have different purposes. Specifically, the liner material 26 may be oxidized to form charge-blocking material (with such oxidation be discussed below with reference to FIG. 8), and the second material 20 may be removed and replaced with conductive wordline materials (with such removal and replacement being described below with reference to FIGS. 11 and 12). Accordingly, the materials 20 and 26 may have different chemical and/or physical properties, even though they both comprise silicon nitride. For instance, material 20 may be formed as a relatively "soft" (e.g., low density) material which is relatively easy to remove with a wet etch. In contrast, the material 26 may be formed as a relatively "hard" material having high quality, and being more difficult to remove with wet-etching. In some embodiments, the silicon nitride of material 20 may be formed with a low-temperature process (e.g., a process utilizing a temperature of less than about 600° C.). In such embodiments, the silicon nitride of material 26 may be formed with atomic layer deposition (ALD) or any other suitable process, and may then be exposed to a high-temperature densification process utilizing a temperature of at least about 700° C., a duration of at least about 60 seconds, and exposure to additional nitrogen (e.g., azide, ammonia, etc.) which may or may not comprise radicals.

The liner material 26 may have any suitable thickness $T_1$, and in some embodiments such thickness may be within a range of from about 4 nm to about 8 nm.

Figure 8:
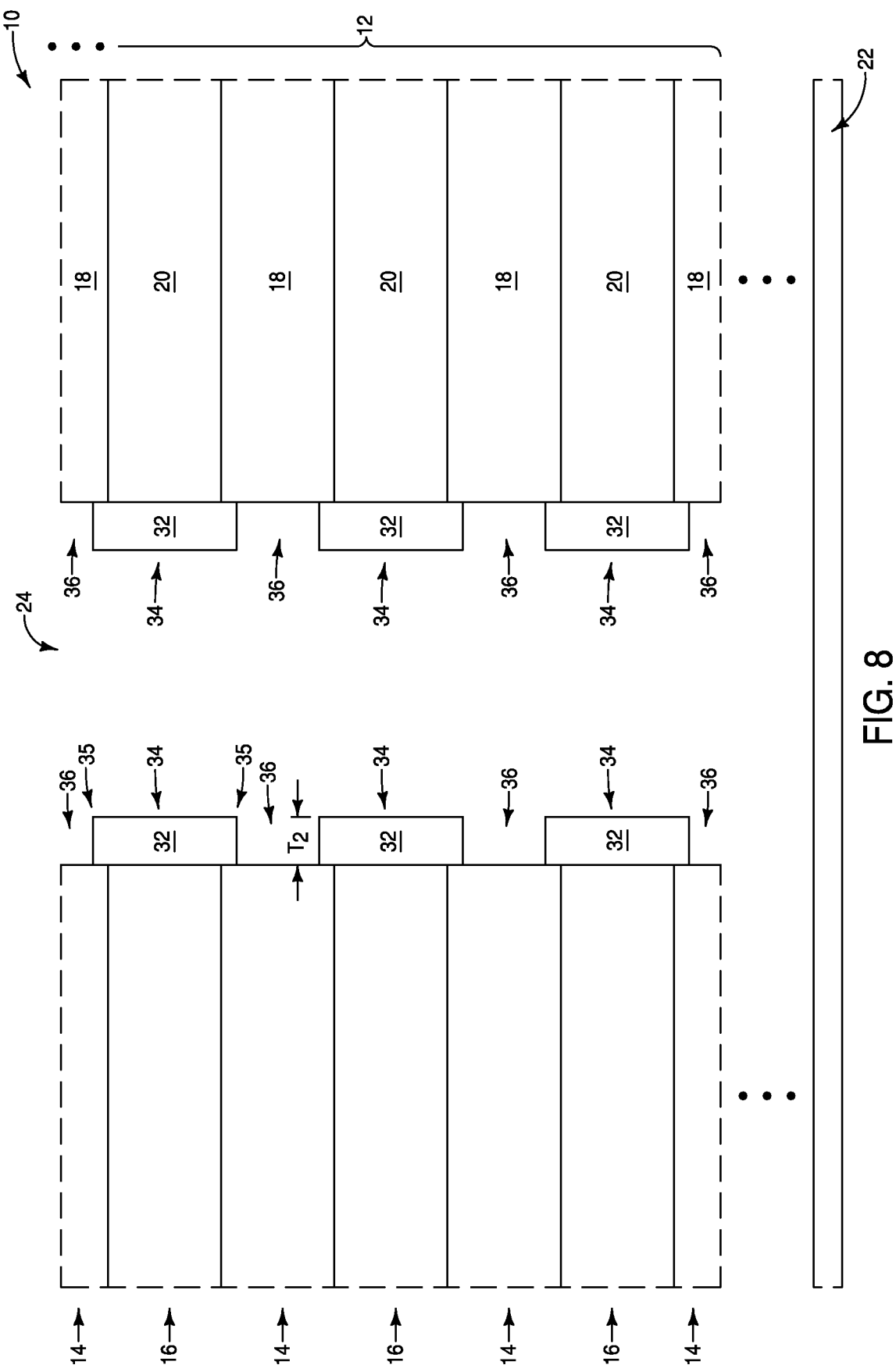

Referring to FIG. 8, the liner material 26 (FIG. 7) is oxidized to convert it into a third material 32 (with the term "third material" being used to distinguish material 32 from the first and second materials 18 and 20). The third material is configured as segments 34, with such segments being vertically spaced from one another by intervening recesses (gaps) 36.

The oxidation of the nitride 26 (FIG. 7) may utilize any suitable processing; including, for example, in situ steam generation (ISSG), rapid thermal oxidation (RTO) etc. In some embodiments, the third material 32 may comprise, consist essentially of, or consist of silicon dioxide. In some embodiments, the third material 32 may comprise, consist essentially of, or consist of silicon oxynitride if some residual nitrogen from the nitride 26 (FIG. 7) remains within the third material 32.

In the shown embodiment, only the material 26 (FIG. 7) is oxidized, and the other nitride material 20 is not oxidized. In other embodiments, some of the material 20 may be oxidized proximate the interface where the material 20 abuts the material 26.

The third material 32 of FIG. 8 is ultimately utilized as charge-blocking regions within NAND memory cells. The third material 32 may have any suitable thickness $T_2$; such as, for example, a thickness within a range of from about 5 nm to about 12 nm.

In the illustrated embodiment of FIG. 8, the segments 34 have square corners 35. In other embodiments (described below with reference to FIG. 17), the segments 34 may have rounded corners.

Figure 9:
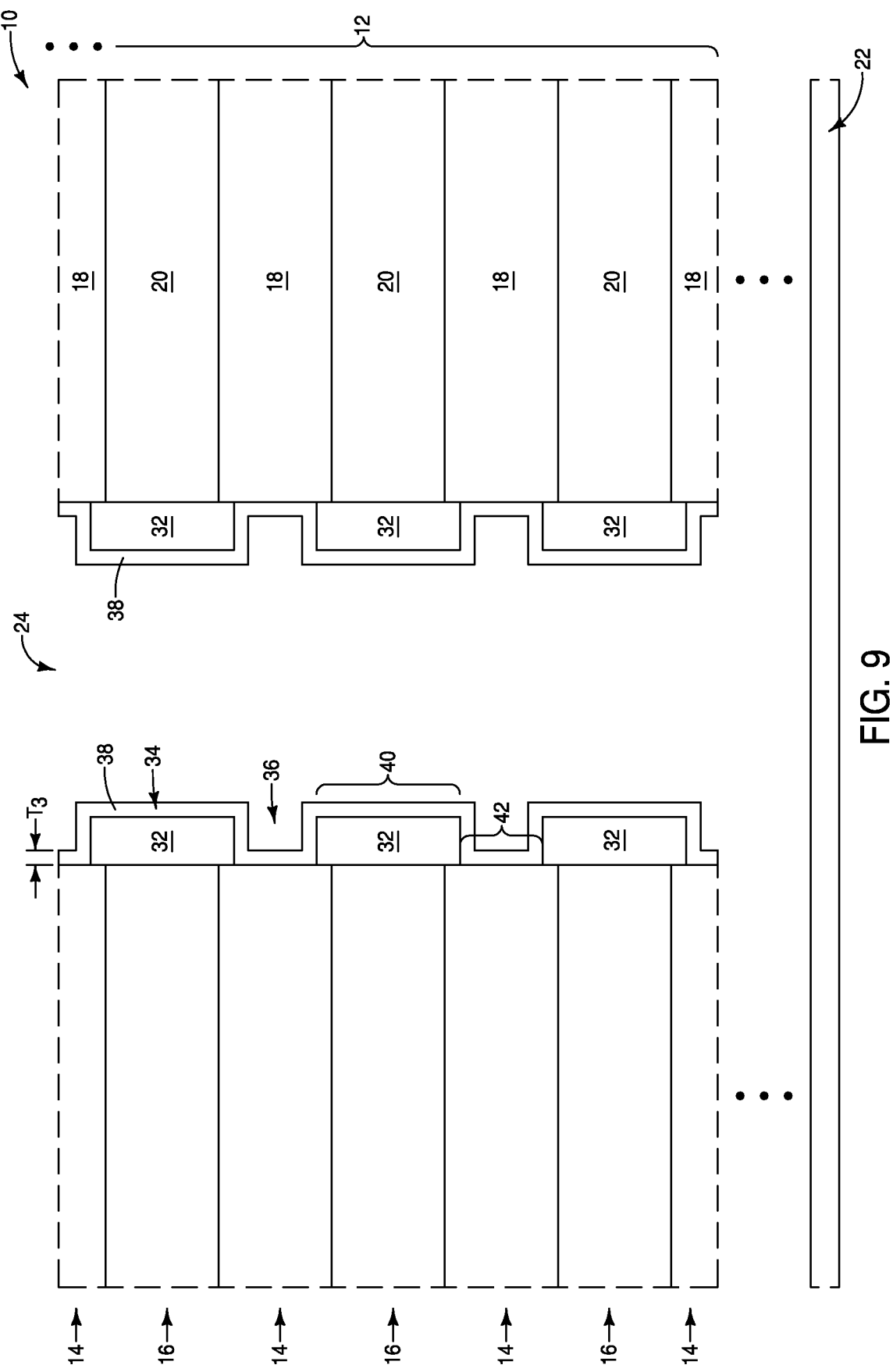

Referring to FIG. 9, charge-storage material 38 is formed to extend along the segments 34 and within the recesses 36. The charge-storage material 38 extends vertically along the first and second levels 14 and 16. In some embodiments the charge-storage material 38 may be considered to comprise first regions 40 along the third material 32, and to comprise second regions 42 within the recesses 36. The charge-storage material 38 may have any suitable thickness $T_3$, and in some embodiments may have a thickness within a range of from about 4 nm to about 10 nm.

The charge-storage material 38 may comprise any suitable composition(s). In some embodiments the charge-storage material 38 may comprise charge-trapping materials, such as silicon nitride, silicon oxynitride, conductive nanodots, etc. For instance, in some embodiments the charge-storage material 38 may comprise, consist essentially of, or consist of silicon nitride. In alternative embodiments, the charge-storage material 38 may be configured to include floating gate material (such as, for example, polycrystalline silicon).

Figure 10:
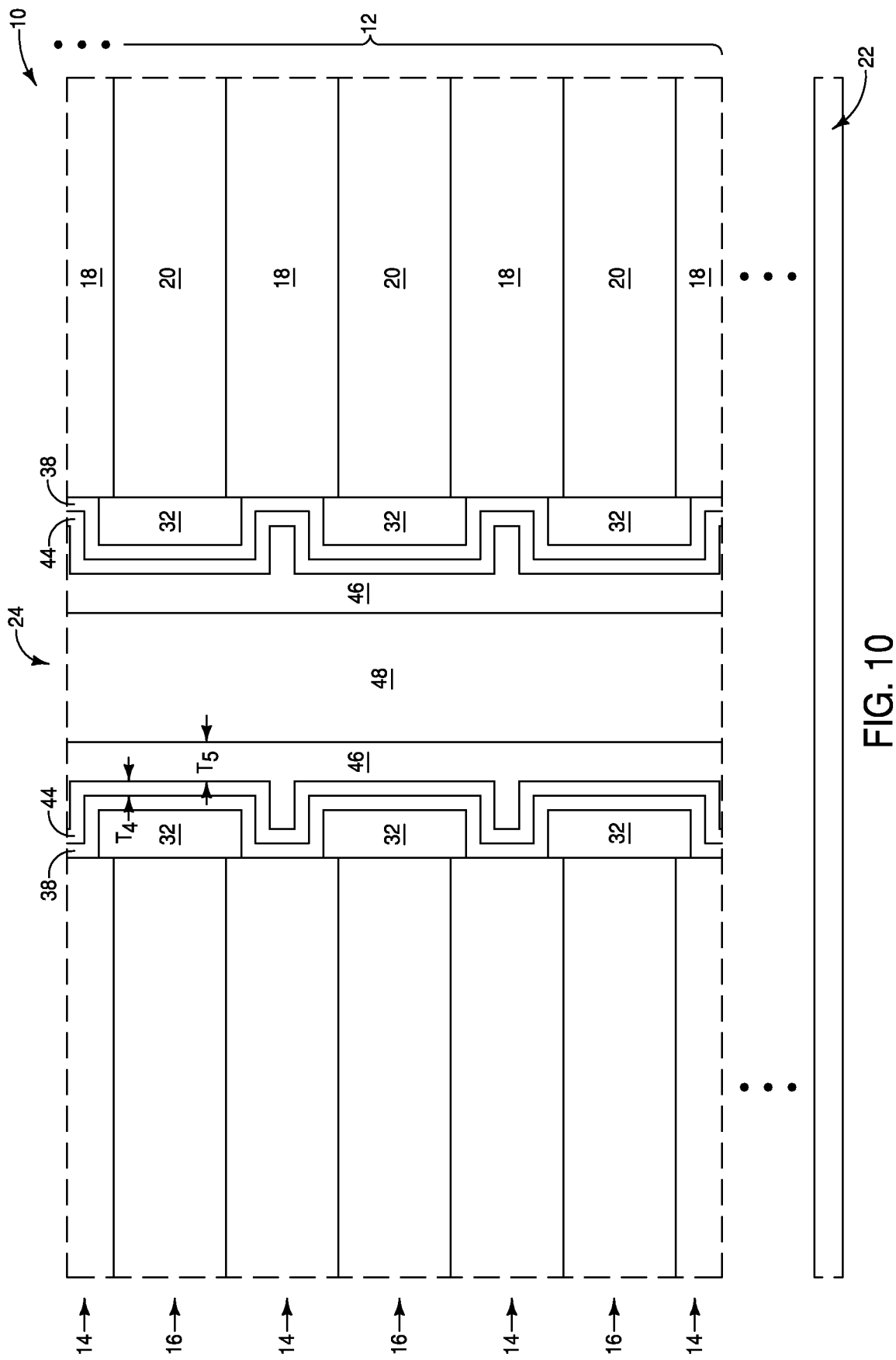

Referring to FIG. 10, tunneling material (gate dielectric material, charge-tunneling material) 44 is formed adjacent the charge-storage material 38, and channel material 46 is formed adjacent the tunneling material. The tunneling material 44 and the channel material 46 both extend vertically along the first and second levels 14 and 16.

The tunneling material 44 may have any suitable thickness $T_4$, and in some embodiments may have a thickness within a range of from about 3 nm to about 8 nm.

The tunneling material 44 may comprise any suitable composition(s). In some embodiments, the tunneling material 44 may comprise, for example, one or more of silicon dioxide, silicon nitride, silicon oxynitride, aluminum oxide, hafnium oxide, zirconium oxide, etc. The tunneling material 44 may be bandgap-engineered to achieve desired electrical properties; and accordingly may comprise a combination of two or more different materials.

The channel material 46 comprises semiconductor material; and may comprise any suitable composition or combination of compositions. For instance, the channel material 46 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 46 may comprise, consist essentially of, or consist of silicon.

In the illustrated embodiment, the channel material 46 only partially fills a central region of the opening 24, and insulative material 48 fills a remaining interior region of the opening 24. The insulative material 48 may comprise any suitable composition or combination of compositions; such as, for example, silicon dioxide. The illustrated configuration of the channel material may be considered to comprise a hollow channel configuration, in that the insulative material 48 is provided within a "hollow" in the annular ring-shaped channel configuration. In other embodiments (not shown), the channel material may be configured as a solid pillar configuration.

The channel material 46 may have any suitable thickness, and in the shown hollow channel configuration may have a thickness $T_5$ within a range of from about 5 nm to about 12 nm.

Figure 11:
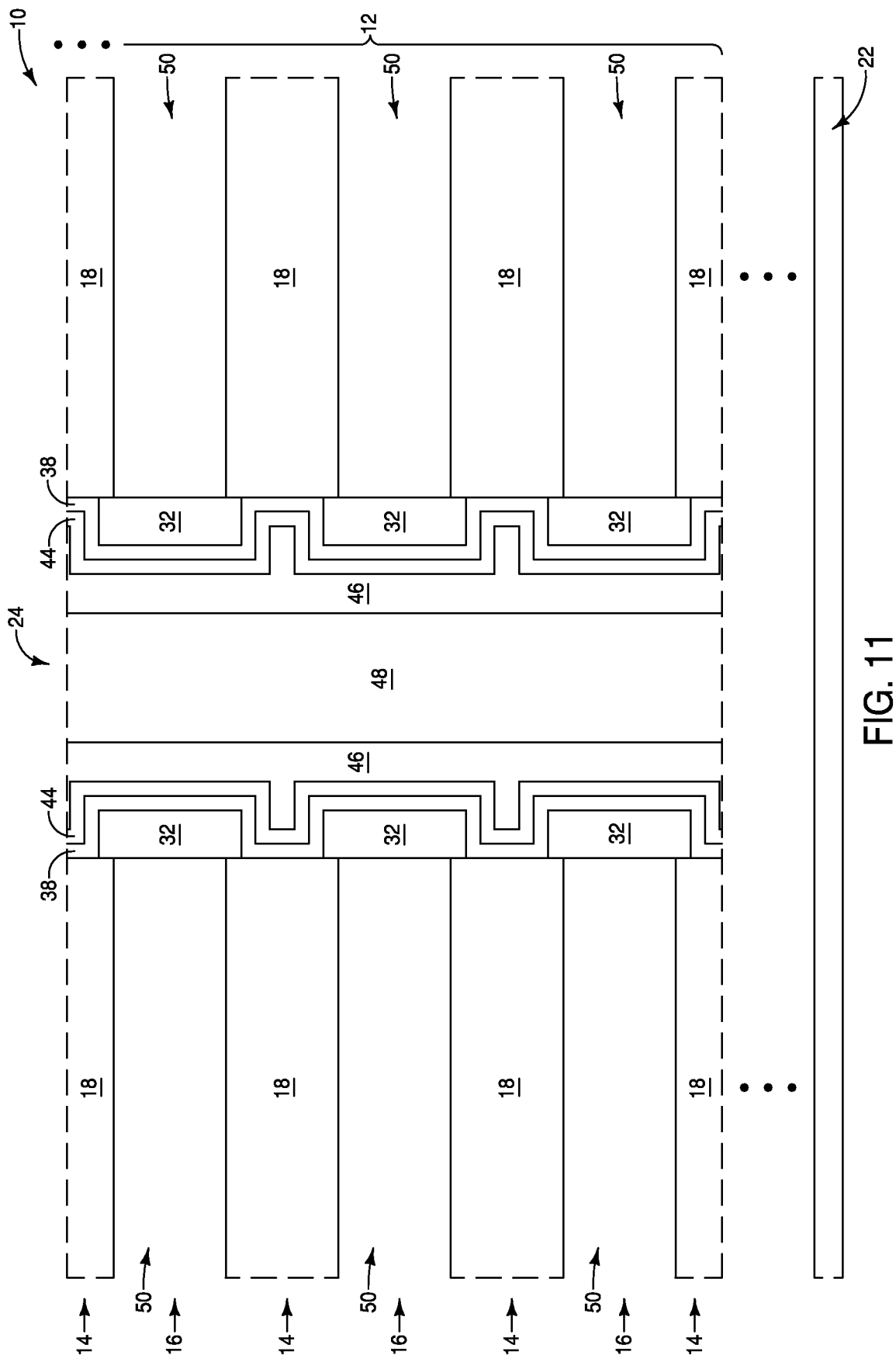

Referring to FIG. 11, the material 20 (FIG. 10) is removed to leave voids 50 along the second levels 16. Such removal may be accomplished with any suitable etch which is selective for the material 20 relative to the materials 18 and 32. For purposes of interpreting this disclosure and the claims that follow, an etch is selective for a second material relative to a first material if the etch removes the second material faster than the first material, which can include, but is not limited to, etches 100% selective for the second material relative to the first material. In a processing step which is not shown, slits (not shown) may be formed through stack 12 at a processing step prior to that of FIG. 11 in order to provide access to the first and second levels 14/16. Etchant may be flowed into such slits to remove the material 20.

Figure 12:
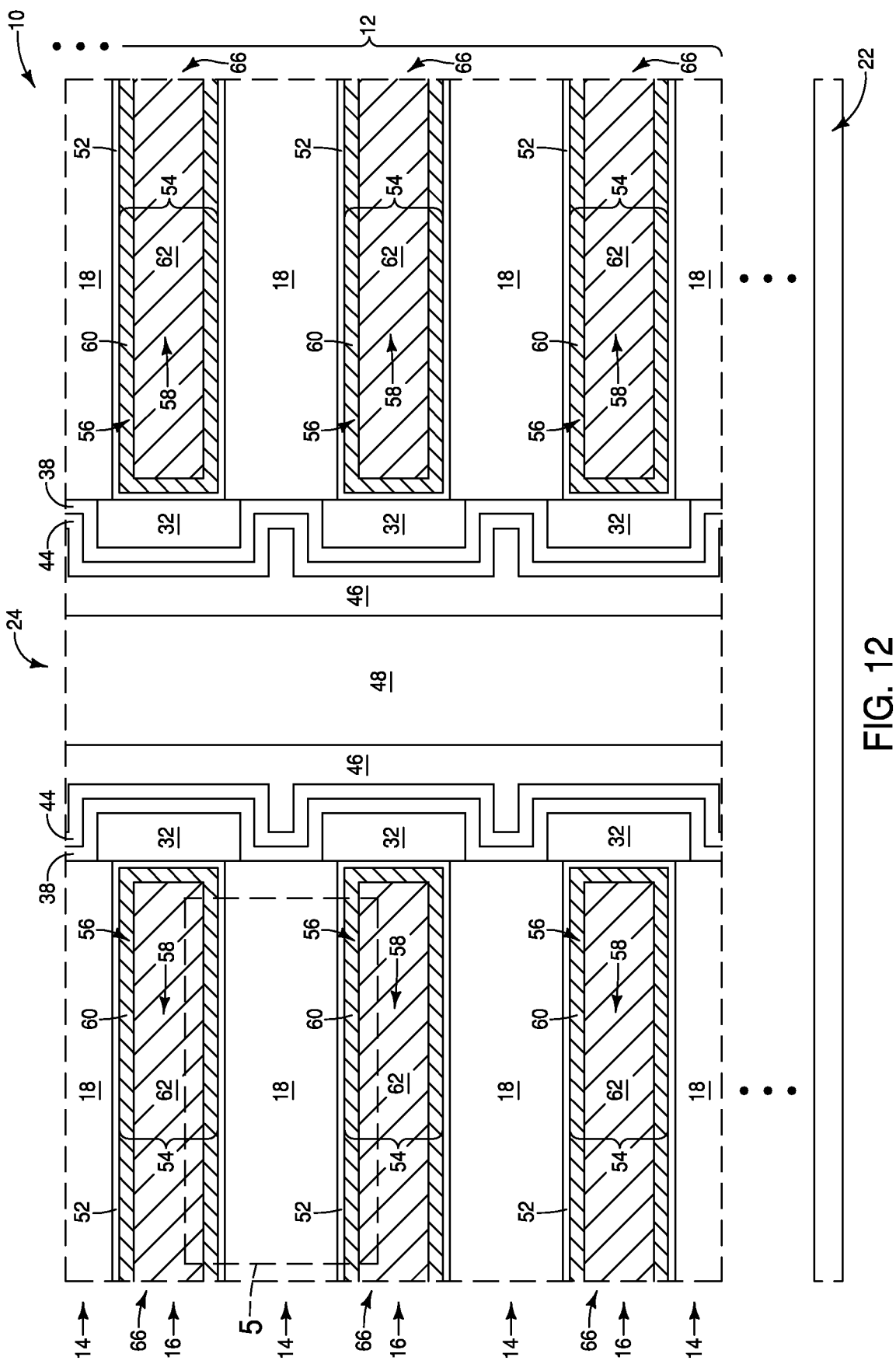

Referring to FIG. 12, the voids 50 (FIG. 11) are lined with dielectric-barrier material 52, and then conductive material 54 is formed within the voids.

The dielectric-barrier material 52 may comprise any suitable composition(s). In some embodiments, the dielectric-barrier material 52 may comprise high-k material (for instance, one or more of aluminum oxide, hafnium oxide, zirconium oxide, tantalum oxide, etc.). In some embodiments, the dielectric-barrier material 52 may comprise, consist essentially of, or consist of aluminum oxide.

The conductive material 54 is shown comprising an outer region 56 and an inner region (or core region) 58. The outer region 56 comprises a first material 60, and the inner region 58 comprises a second material 62. The materials 60 and 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the material 60 may comprise one or more metal nitrides; and may, for example, comprise, consist essentially of, or consist of the titanium nitride. In some embodiments, the material 62 may comprise, consist essentially of, or consist of tungsten.

The conductive material 54 is configured as wordlines 66 which extend within the second levels 16. In some embodiments the second levels 16 may be referred to as wordline levels to reflect that they comprise the wordlines 66. In some embodiments the conductive material 54 may be referred to as conductive wordline material to reflect that it is incorporated into the wordlines 66.

Figure 12A:
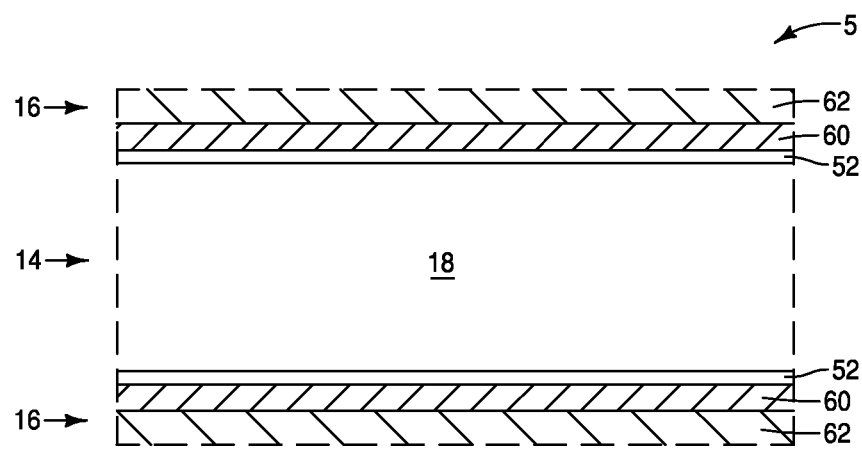
FIGS. 12A-12C are diagrammatic cross-sectional side views of a region labeled "5" of the integrated assembly of FIG. 12.
Figure 12B:
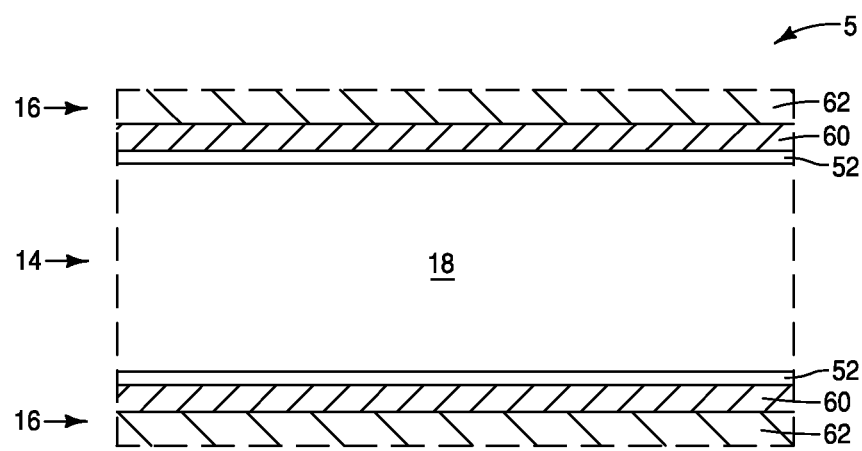
Figure 12C:
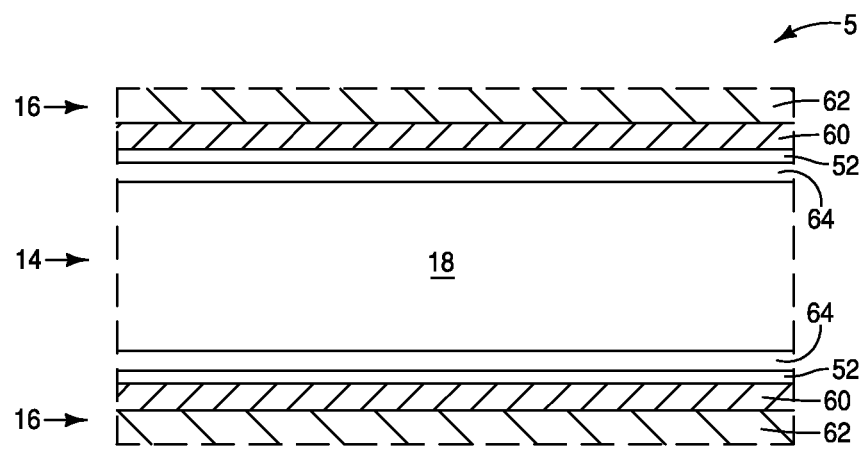

The next processing step (described below with reference to FIG. 13) will be to remove the material 18 of the first levels 14. In some embodiments the material within the first levels 14 may be tailored for particular applications. FIGS. 12A-12C show isolated views of a region 5 of FIG. 12, and show different configurations for the material within the first levels 14.

FIG. 12A shows a configuration which a homogeneous material 18 is provided within the levels 14. The material 18 may comprise, consist essentially of, or consist of silicon dioxide. The single homogeneous material within the levels 14 will etch uniformly. The material consisting essentially of, or consisting of silicon dioxide may etch relatively slowly as compared to other suitable materials.

FIG. 12B shows another configuration in which a homogeneous material 18 is provided within the levels 14. However, the material 18 of FIG. 12B may comprise doped silicon oxide (e.g., phosphorus doped silicon dioxide). The doped silicon oxide may be more rapidly etched than pure silicon dioxide.

FIG. 12C shows a configuration in which the first material 18 is sandwiched between upper and lower films of additional material 64. In some embodiments, the material 18 may comprise doped silicon oxide, and the additional material 64 may consist essentially of, or consist of silicon dioxide. Accordingly, the material 18 may be rapidly etched to leave a thin layer of oxide 64 along the dielectric-barrier material 52.

Figure 13:
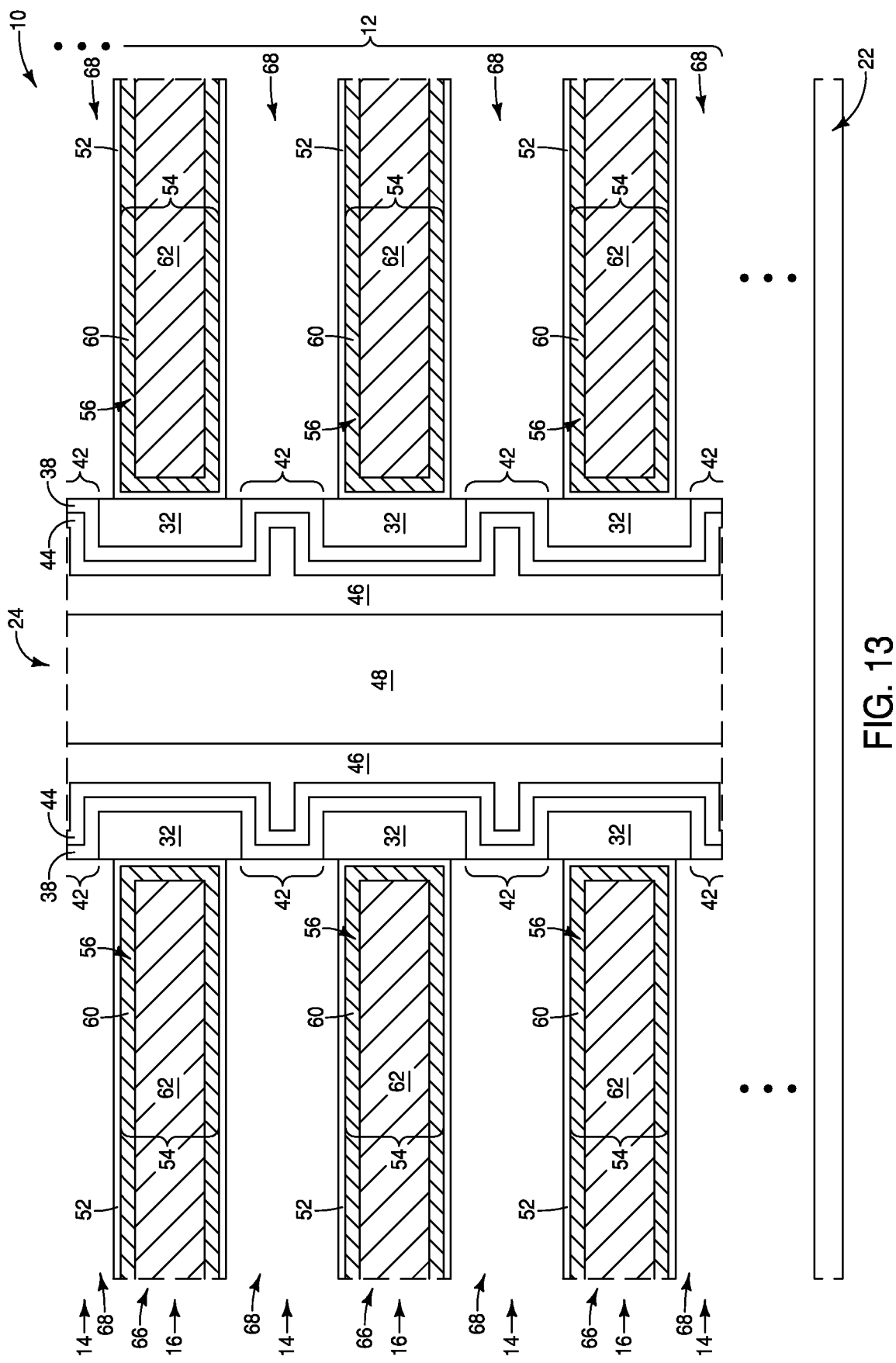
FIG. 13 is a diagrammatic cross-sectional side view of the region of the integrated assembly of FIG. 5 shown at an example process stage following the process stage of FIG. 12.

Referring to FIG. 13, the material 18 (FIG. 12) is removed to leave voids 68 along the first levels 14. In some embodiments, the voids 68 of FIG. 13 may be referred to as second voids to distinguish them from the first voids 50 described above with reference to FIG. 11. The second regions 42 of the charge-storage material 38 are exposed along edges of the voids 68.

Figure 13A:
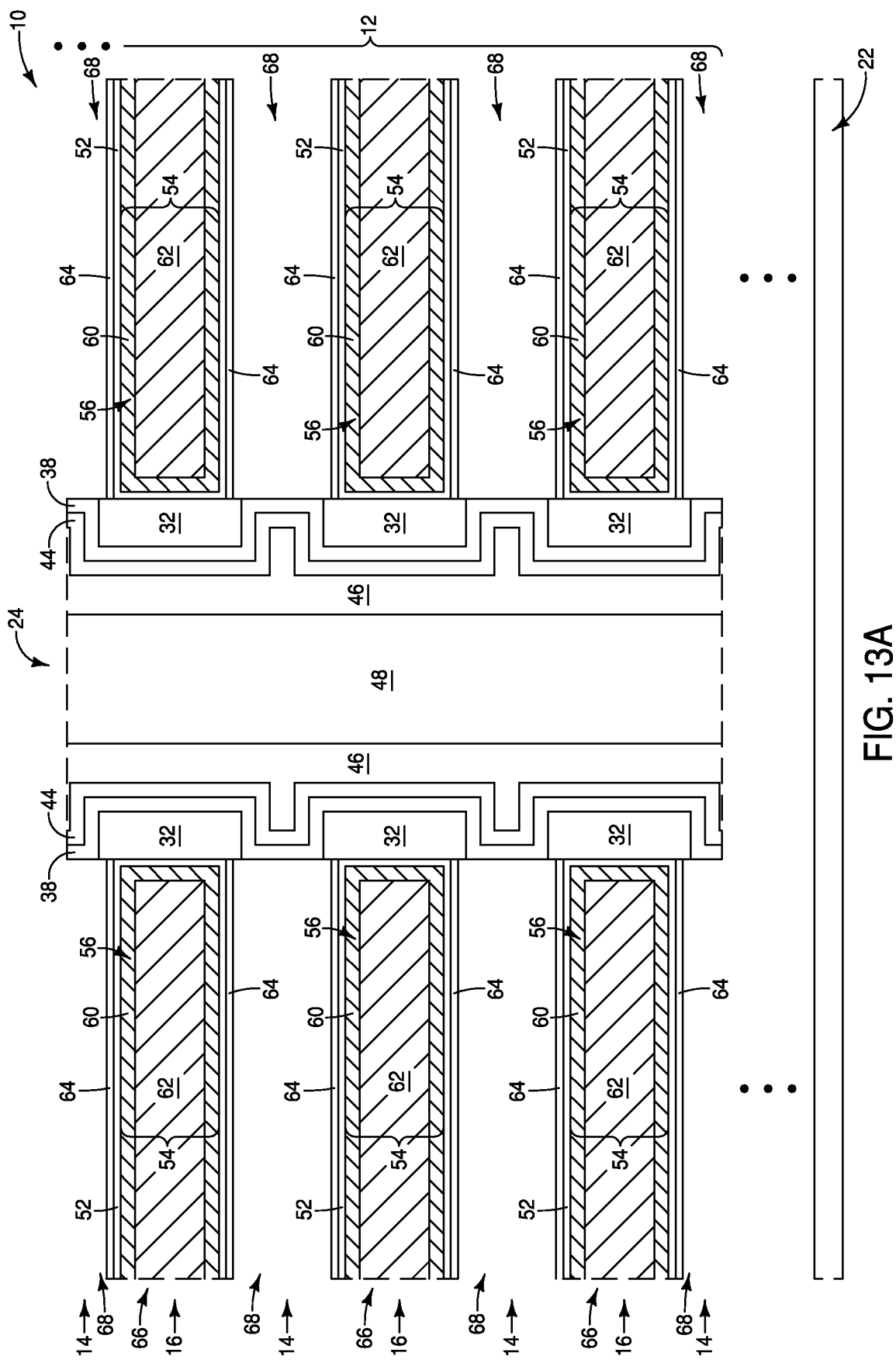
FIG. 13A is a diagrammatic cross-sectional side view of the region of the integrated assembly of FIG. 5 shown at another example stage following the process stage of FIG. 12.

FIG. 13 shows an embodiment in which the material 18 of FIG. 12 is homogeneous, and is all removed to leave the voids 68. FIG. 13A shows an alternative embodiment in which the material 18 within the levels 14 is part of a configuration of the type described above with reference to FIG. 12C. Accordingly, the material 18 is removed to leave the voids 68, but the additional material 64 remains to line upper and lower edges of the voids 68. The remaining figures of this application pertain to embodiments which follow the processing stage of FIG. 13. It is to be understood, however, that analogous embodiments may follow the processing stage of FIG. 13A.

Figure 14:
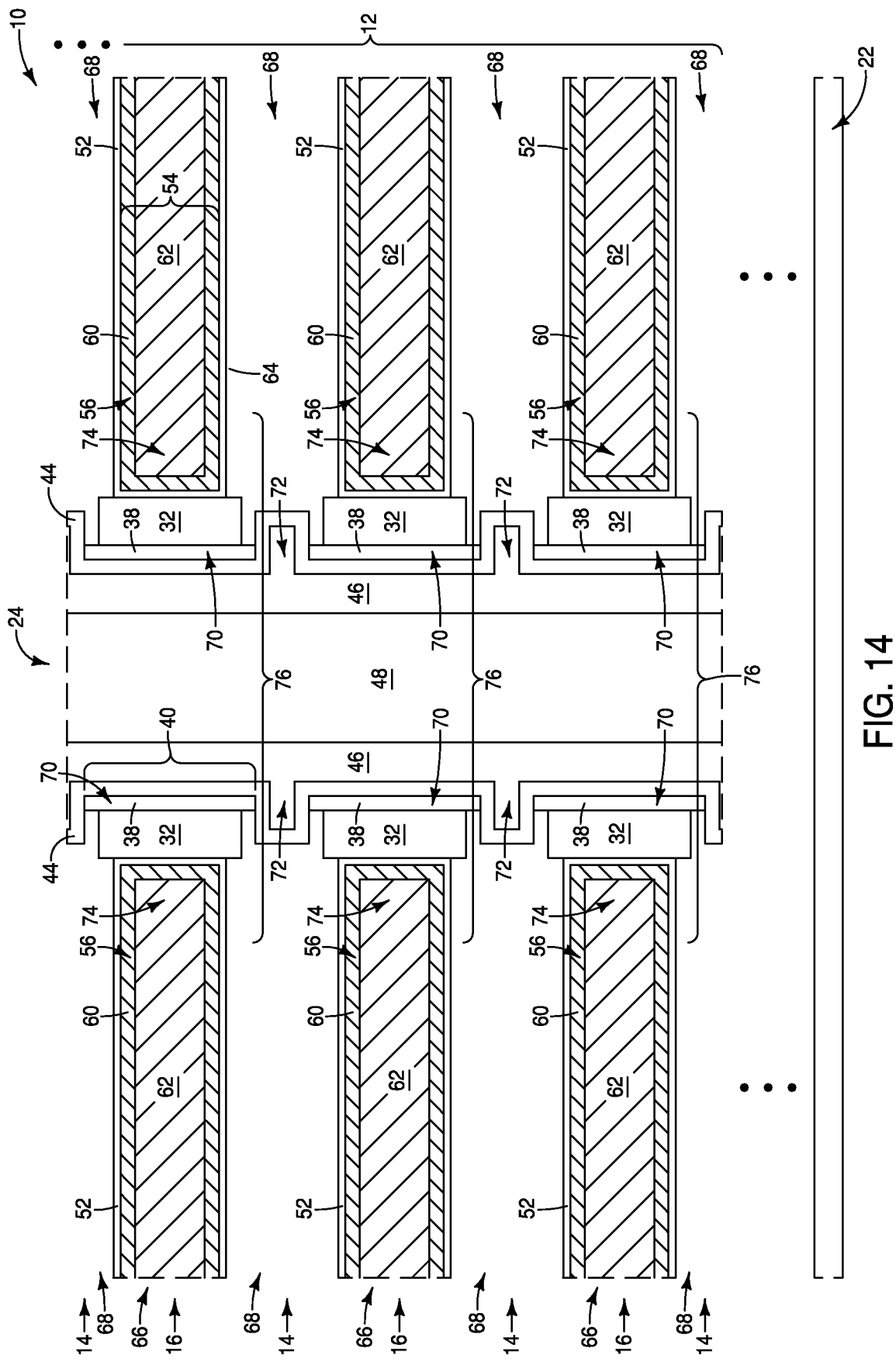
FIGS. 14 and 15 are diagrammatic cross-sectional side views of the region of the integrated assembly of FIG. 5 shown at example sequential process stages following the process stage of FIG. 13.

Referring to FIG. 14, the assembly 10 is shown at a processing stage subsequent to that of FIG. 13, and specifically after the second regions 42 (FIG. 13) of charge-storage material 38 removed. Such removal may be accomplished by flowing etchant into the voids 68. The remaining first regions 40 of the charge-storage material are configured as segments 70. In some embodiments, the segments 34 (FIG. 8) and the segments 70 may be referred to as first and second segments, respectively, to distinguish them from one another.

The segments 70 are adjacent (or along) the second levels 16, and are vertically spaced from one another by gaps 72 adjacent (or along) the first levels 14. In some embodiments, the gaps 72 may be referred to as intervening insulative regions.

The assembly 10 of FIG. 14 may be considered to include wordline levels 16 alternating with insulative levels 14 within a stack 12. The wordline levels may be considered to comprise gate regions 74 proximate the charge-storage material 38, and spaced from such charge-storage material by the dielectric-barrier material 52 and the charge-blocking material 32. Regions of the channel material 46 are adjacent the charge-storage material 38, and are spaced from the charge-storage material by the tunneling material 44. The gate regions 74, together with the materials 52, 32, 38, 44 and 46 form NAND memory cells 76. The NAND memory cells are vertically stacked one atop another, and are along the wordline levels 16.

In operation, the charge-storage material 38 may be configured to store information in the memory cells 76. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 74, and/or based on the value of voltage applied to the channel material 46.

The tunneling material 44 forms tunneling regions of the memory cells 76. Such tunneling regions may be configured to allow desired migration (e.g., transportation) of charge (e.g., electrons) between the charge-storage material 38 and the channel material 46. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 32 is adjacent to the charge-storage material 38, and may provide a mechanism to block charge from flowing from the charge-storage material 38 to the associated gates 74.

The dielectric-barrier material 52 is provided between the charge-blocking material 32 and the associated gates 74, and may be utilized to inhibit back-tunneling of charge carriers from the gates 74 toward the charge-storage material 38. In some embodiments, the dielectric-barrier material 52 may be considered to form dielectric-barrier regions within the memory cells 76.

Figure 15:
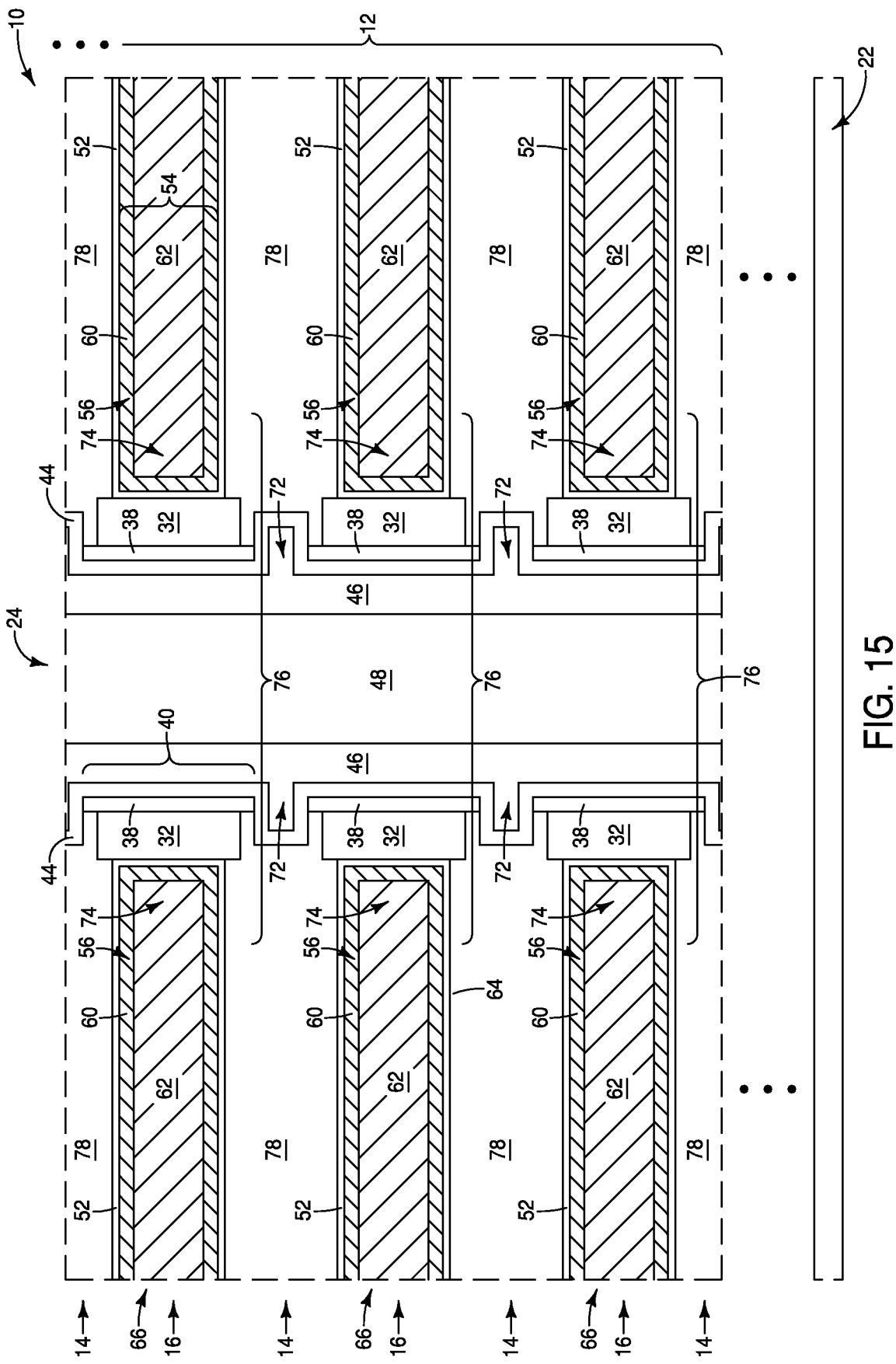

The voids 68 may remain along the insulative levels 14 in a finished memory array. Alternatively, the voids 68 may be at least partially filled with one or more insulative materials. FIG. 15 shows a processing stage which may follow that of FIG. 14, and in which the voids 68 are filled with insulative material 78. Such insulative material may comprise any suitable composition(s); and in some embodiments may comprise, consist essentially of, or consist of silicon dioxide. In some embodiments, the material 78 may be referred to as a fourth material to distinguish it from the first, second and third materials 18, 20 and 32 described above.

The processing of FIGS. 7-15 forms the segments 34 (shown in, for example, FIG. 8) of the charge-blocking material 32 to have substantially square corners. In other embodiments, the corners of the segments 34 may be rounded which may improve vertical separation between vertically-stacked charge-storage regions (e.g., the vertically-stacked segments 70 shown in FIG. 14). FIGS. 16-24 illustrate process stages of an example embodiment which may be utilized to form segments 34 of charge-blocking material 32 having rounded corners instead of the square corners of the embodiment of FIGS. 7-15.

Figure 16:
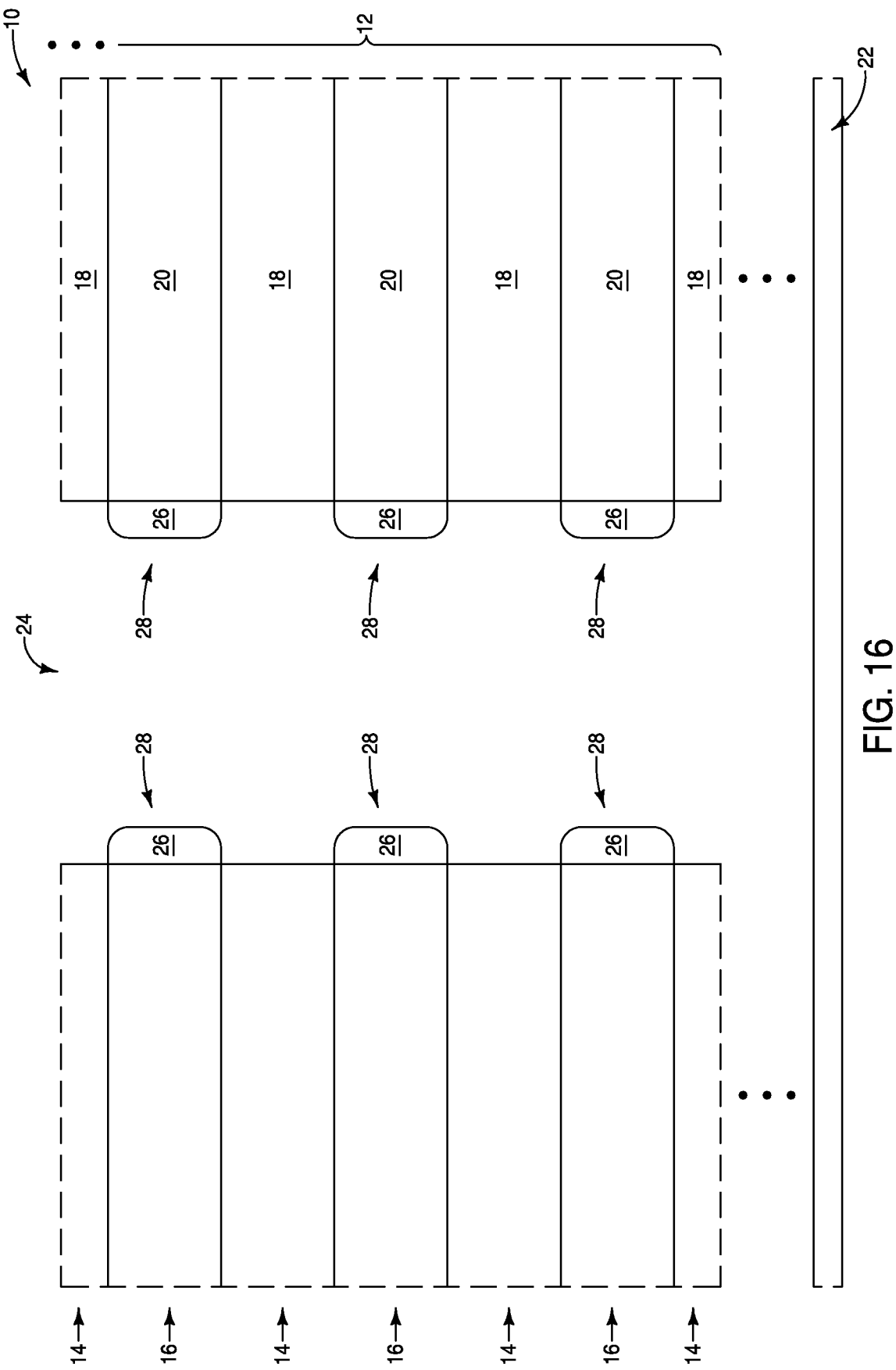
FIG. 16 is a diagrammatic cross-sectional side view of a region of an integrated assembly at an example process stage of an example method for forming an example memory array. The processing stage of FIG. 16 may follow that of FIG. 6 or that of FIG. 7 in some embodiments.

Referring to FIG. 16, the assembly 10 is shown as a process stage analogous to that of FIG. 7. However, the segments 28 of the liner material 26 have rounded corners instead of the square corners shown in FIG. 7. The configuration of FIG. 16 may result from aggressive nitridation of the liner material 26, from etching, and/or from any other suitable treatment. The configuration of FIG. 16 may follow the process stage of FIG. 6 or may follow the process stage of FIG. 7.

Figure 17:
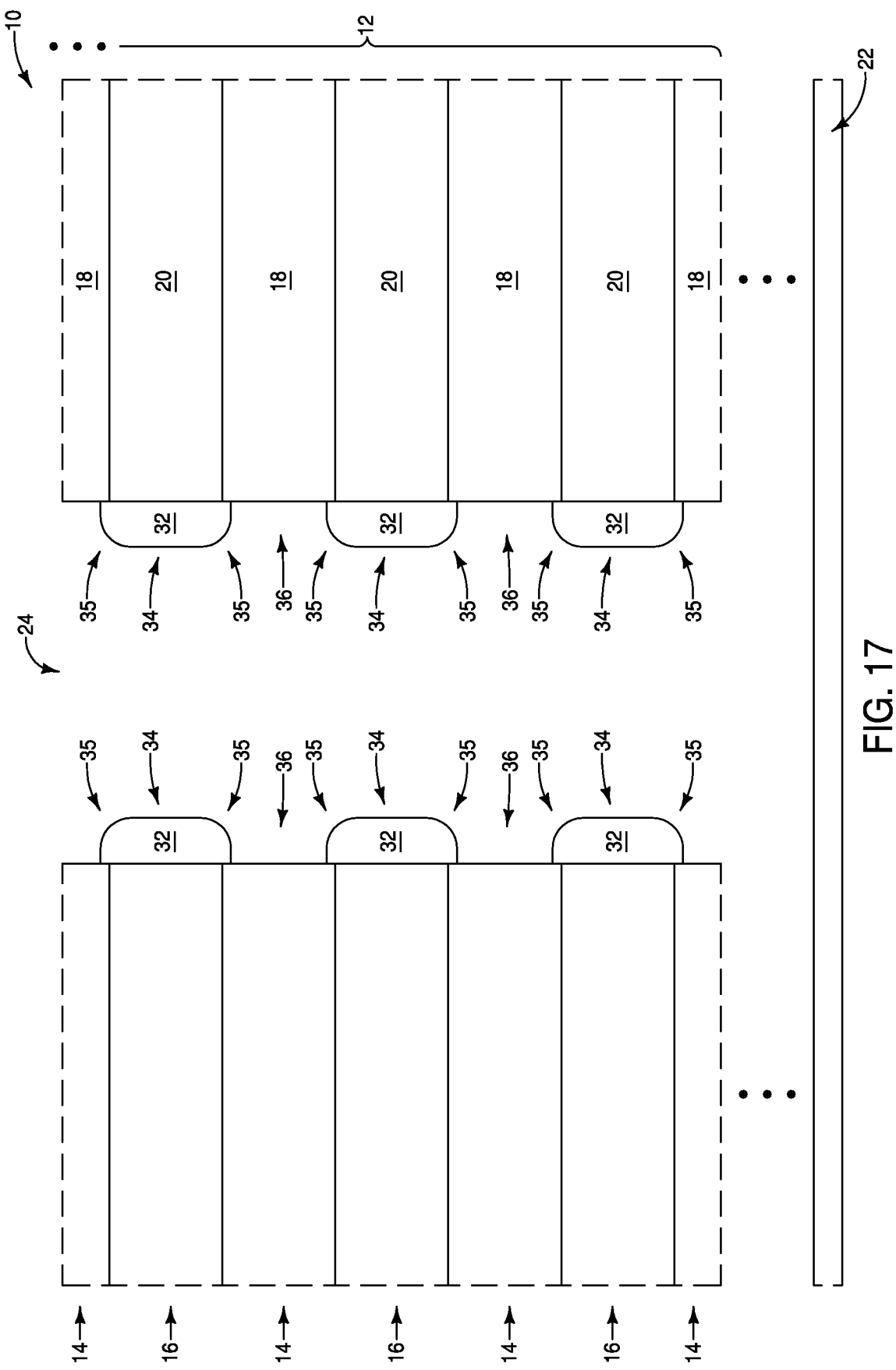
FIGS. 17-24 are diagrammatic cross-sectional side views of the region of the integrated assembly of FIG. 16 shown at example sequential process stages following the process stage of FIG. 16.

Referring to FIG. 17, the liner material 26 is oxidized to form the third material (charge-blocking material) 32. The material 32 is configured as the segments 34 which are vertically-spaced from one another by the gaps 36. In the embodiment of FIG. 17, the segments 34 have rounded corners 35 due to being grown from the liner material 26 having the rounded corners shown in FIG. 16.

Figure 18:
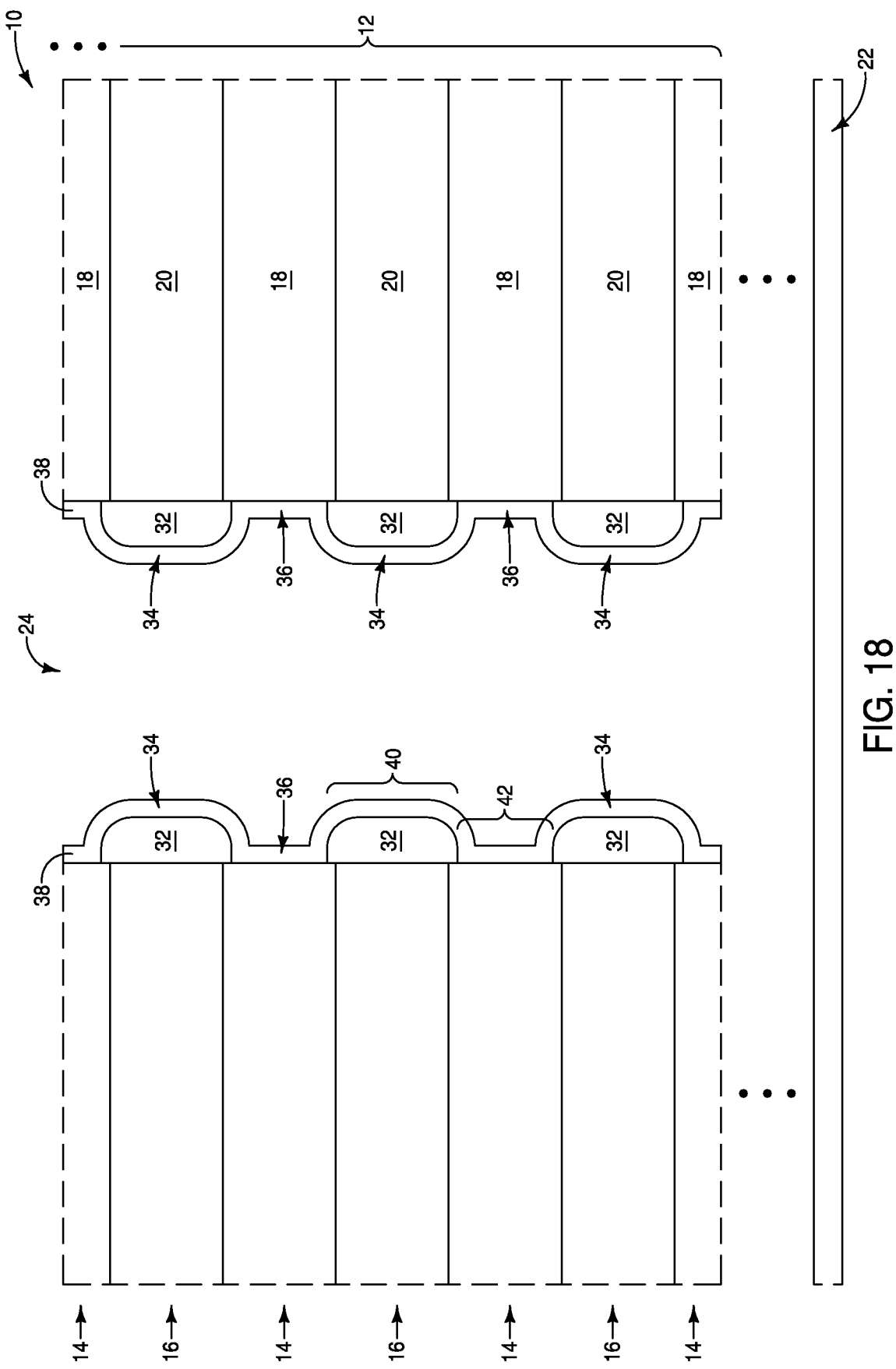

Referring to FIG. 18, the charge-storage material 38 is formed to extend along the segments 34 and within the recesses 36. The charge-storage material 38 of FIG. 18 may be deposited utilizing processing analogous to that described above with reference to FIG. 9. The charge-storage material 38 has first and second regions 40 and 42 analogous to those described above with reference to FIG. 9.

Figure 19:
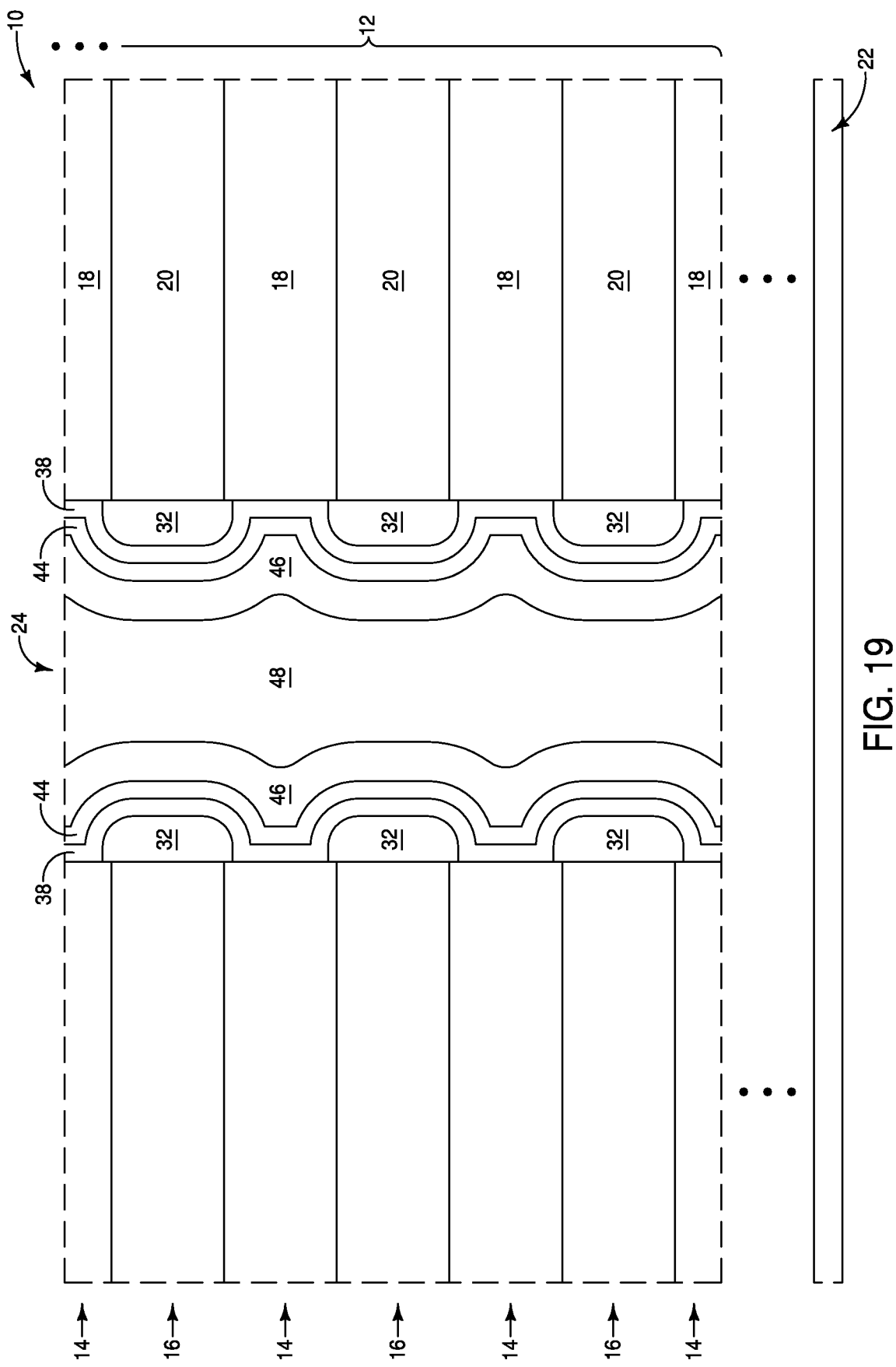

Referring to FIG. 19, the tunneling material (gate dielectric material, charge-tunneling material) 44 is formed adjacent the charge-storage material 38, and the channel material 46 is formed adjacent the tunneling material. The insulative material 48 is provided adjacent the channel material 46. The materials 44, 46 and 48 may be formed utilizing processing analogous to that described above with reference to FIG. 10.

Figure 20:
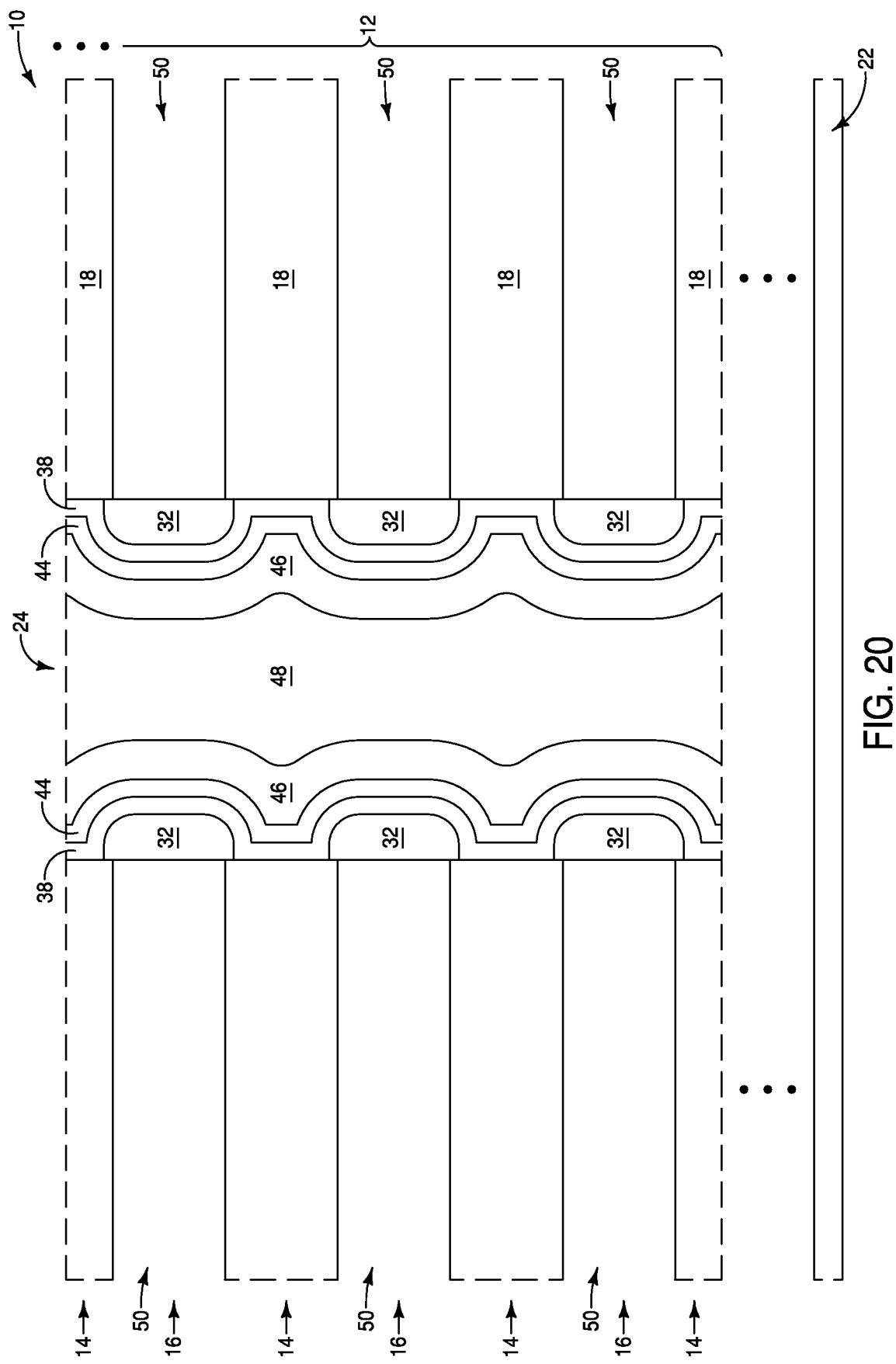

Referring to FIG. 20, the material 20 (FIG. 19) is removed to form the voids 50. Such removal may be accomplished with processing analogous to that described above with reference to FIG. 11.

Figure 21:
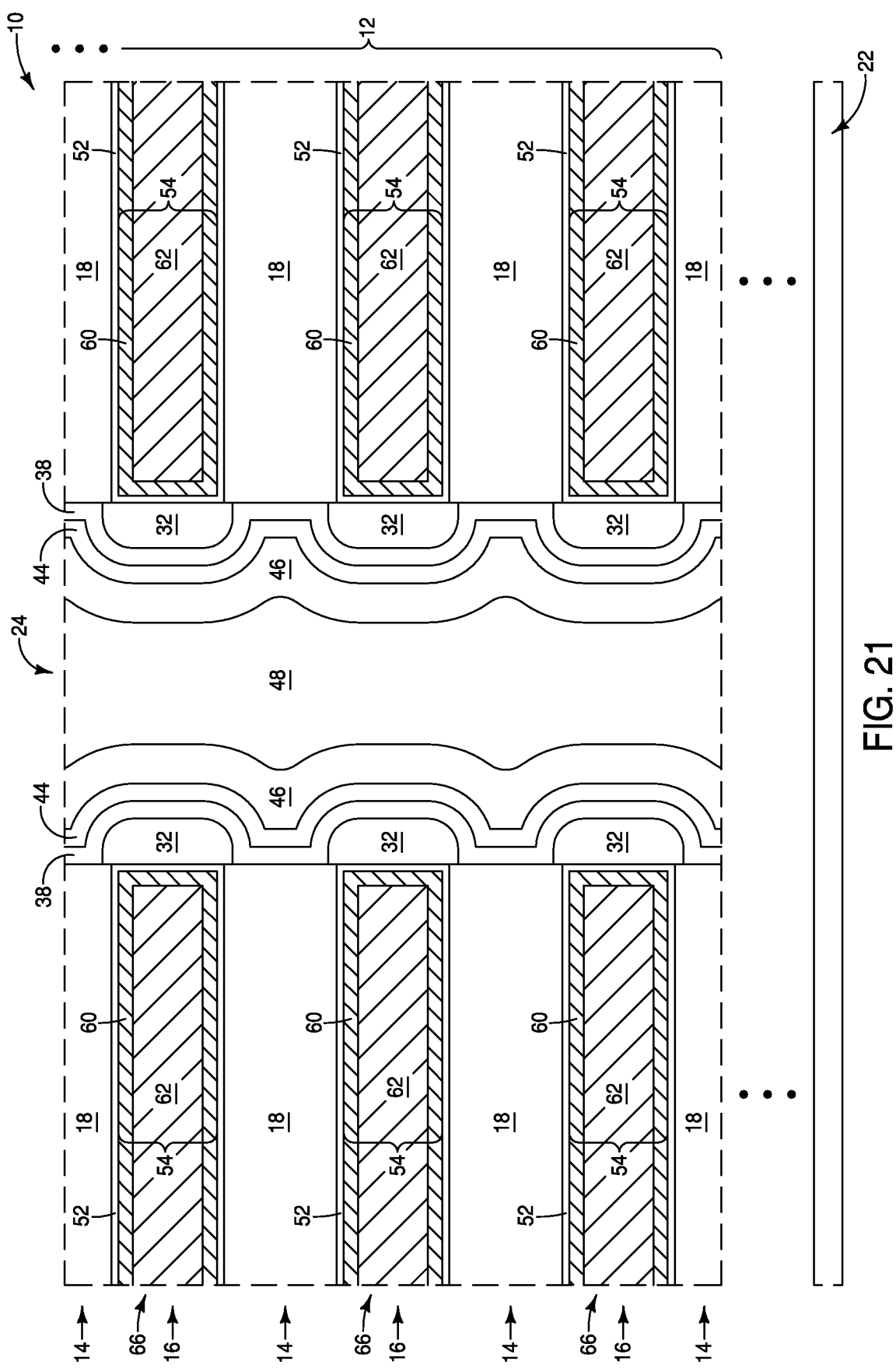

Referring to FIG. 21, the materials 52, 60 and 62 are formed within the voids 50 (FIG. 20) with processing analogous to that described above with reference to FIG. 12. The materials 60 and 62 may be together considered to be the conductive wordline material 54.

Figure 22:
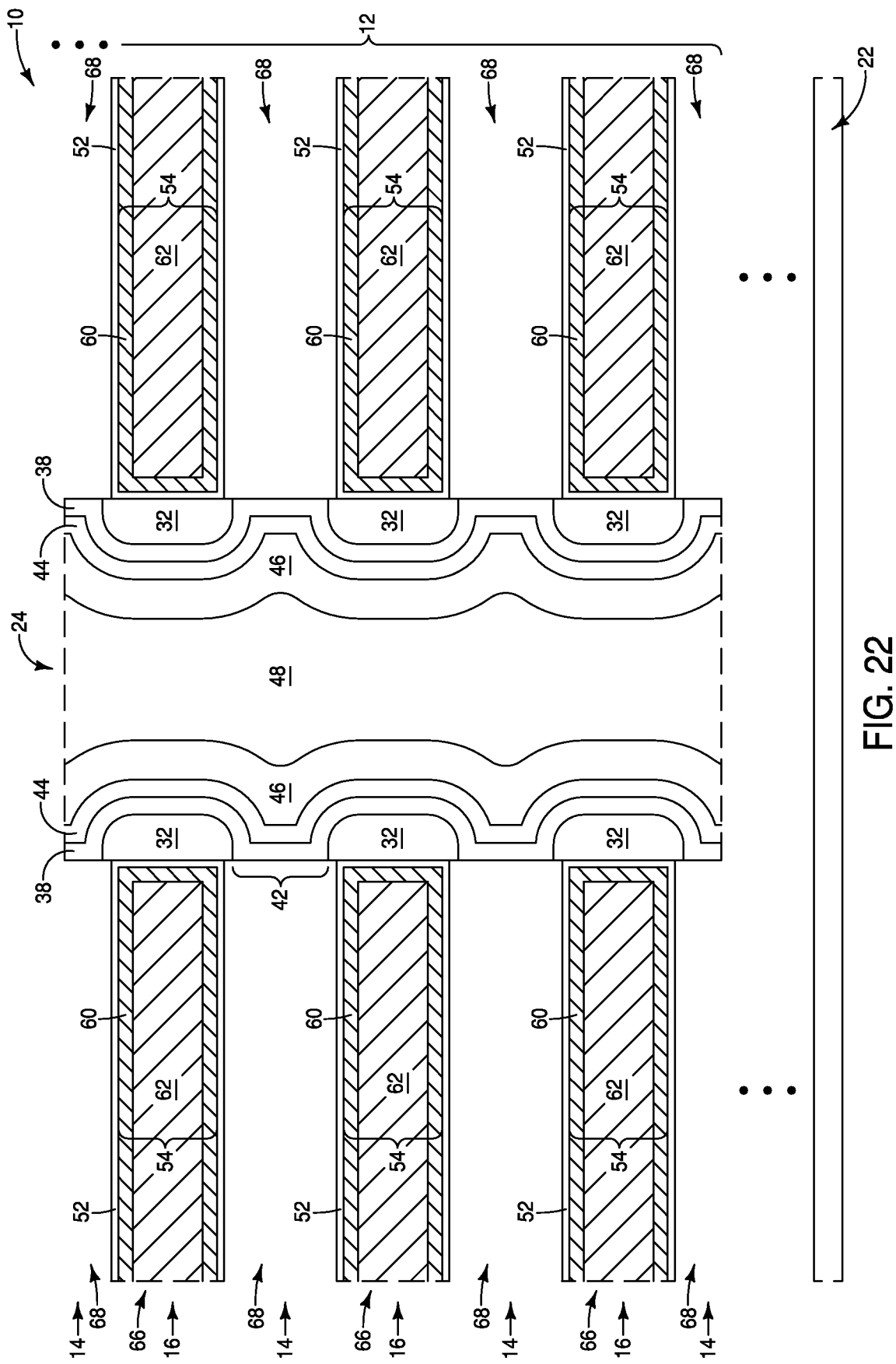

Referring to FIG. 22, the material 18 (FIG. 21) is removed to leave voids 68 along the first levels 14. Such removal may be accomplished with processing described above with reference to FIG. 13 (or, in alternative embodiments, with processing described above with reference to FIG. 13A). The second regions 42 of the charge-storage material 38 are exposed along edges of the voids 68.

Figure 23:
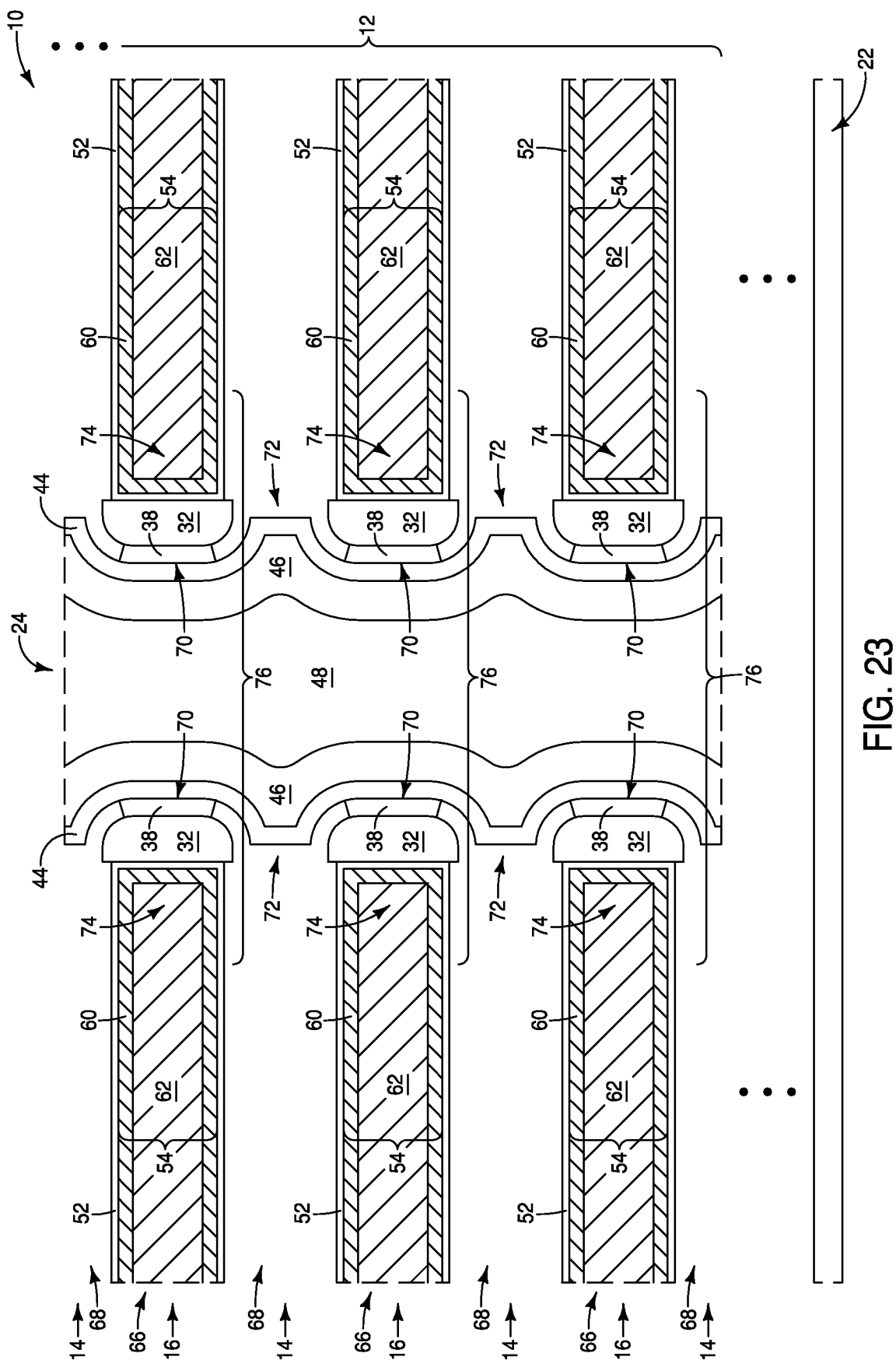

Referring to FIG. 23, the assembly 10 is shown at a processing stage subsequent to that of FIG. 22, and specifically after the second regions 42 (FIG. 22) of charge-storage material 38 removed. Such removal may be accomplished with processing analogous to that described above with reference to FIG. 14 The remaining regions of the charge-storage material 36 (corresponding to portions of the first regions 40 of FIG. 18) are configured as segments 70. The segments 70 are adjacent (or along) the second levels 16, and are vertically spaced from one another by gaps 72 adjacent (or along) the first levels 14.

The assembly 10 of FIG. 23 may be considered to include the wordline levels 16 alternating with the insulative levels 14 within the stack 12. The wordline levels may be considered to comprise the gate regions 74 proximate the charge-storage material 38, and spaced from such charge-storage material by the dielectric-barrier material 52 and the charge-blocking material 32. The gate regions 74, together with the materials 52, 32, 38, 44 and 46 form the NAND memory cells 76. The NAND memory cells are vertically stacked one atop another, and are along the wordline levels 16.

Figure 24:
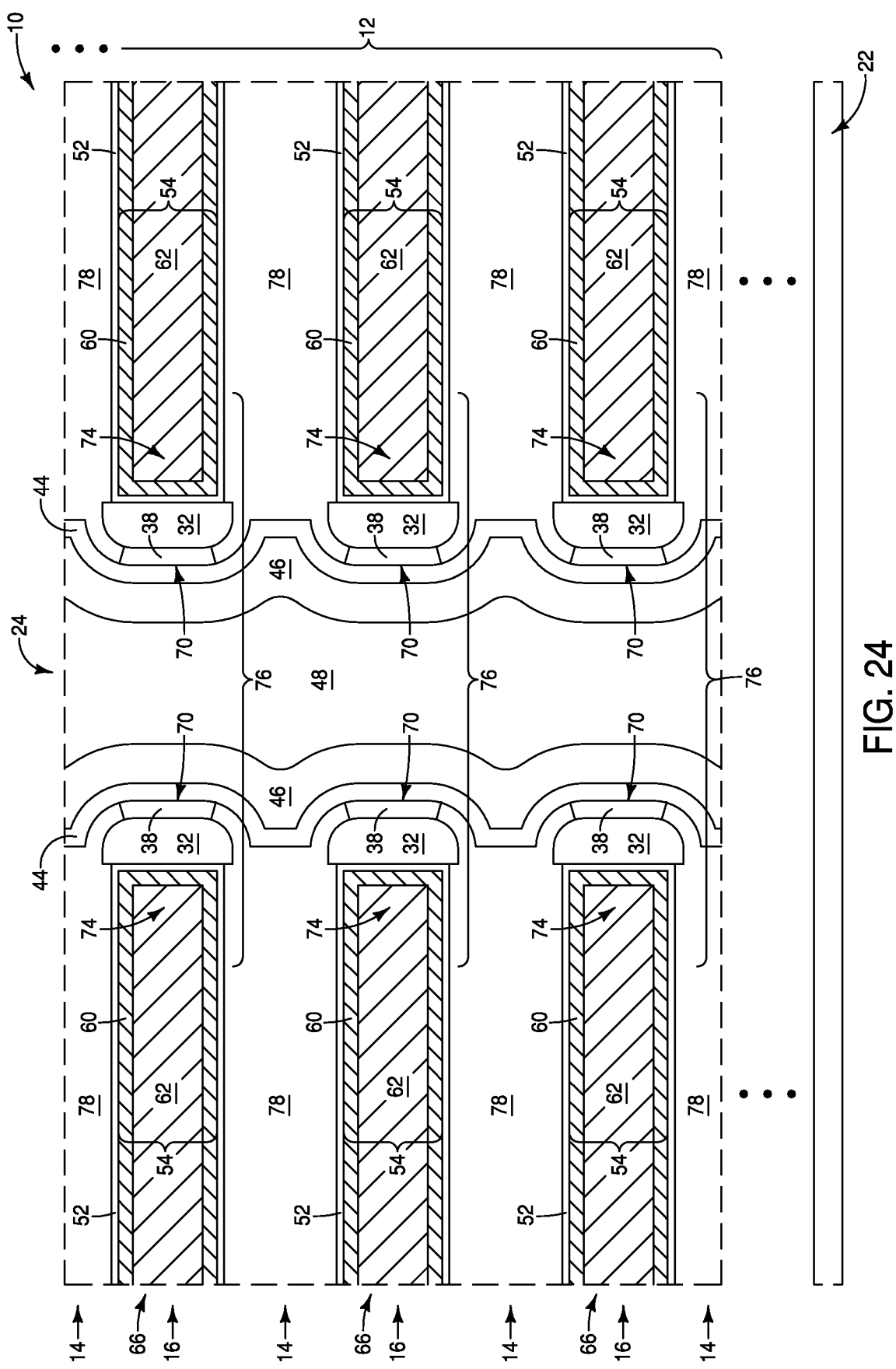

The voids 68 may remain along the insulative levels 14 in a finished memory array. Alternatively, the voids 68 may be at least partially filled with one or more insulative materials. FIG. 24 shows a processing stage which may follow that of FIG. 23, and in which the voids 68 are filled with the insulative material 78.

Figure 25:
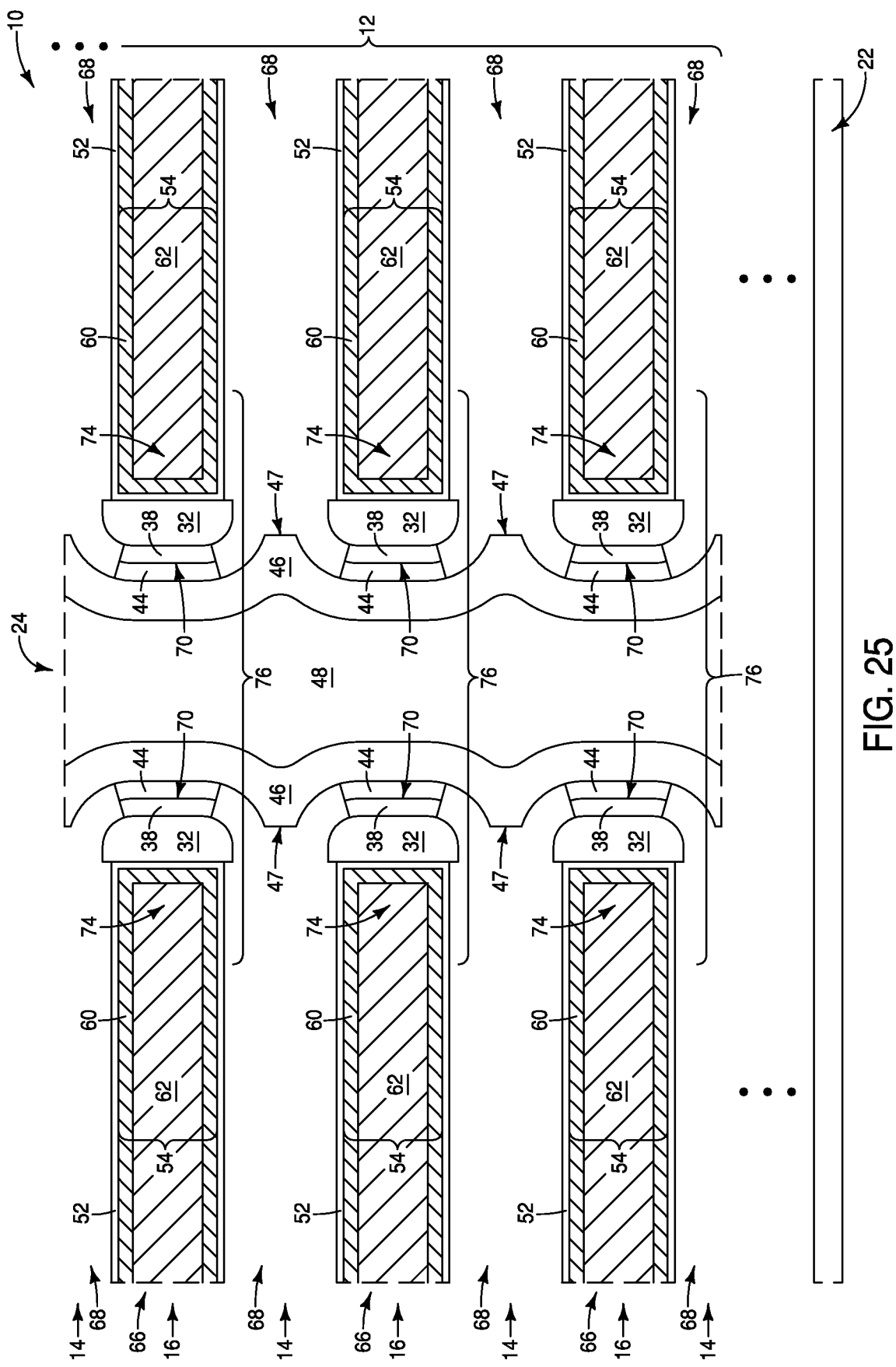
FIGS. 25-29 are diagrammatic cross-sectional side views of the region of the integrated assembly of FIG. 16 shown at example sequential process stages following the process stage of FIG. 23 in accordance with another example embodiment.

In some embodiments, the voids 68 of FIG. 14 or 23 may be extended through the tunneling material 44 to expose a surface of the channel material 46. For instance, FIG. 25 shows a processing stage which may follow that of FIG. 23, and shows regions of the tunneling material 44 removed to expose surfaces 47 of the channel material 46.

Figure 26:
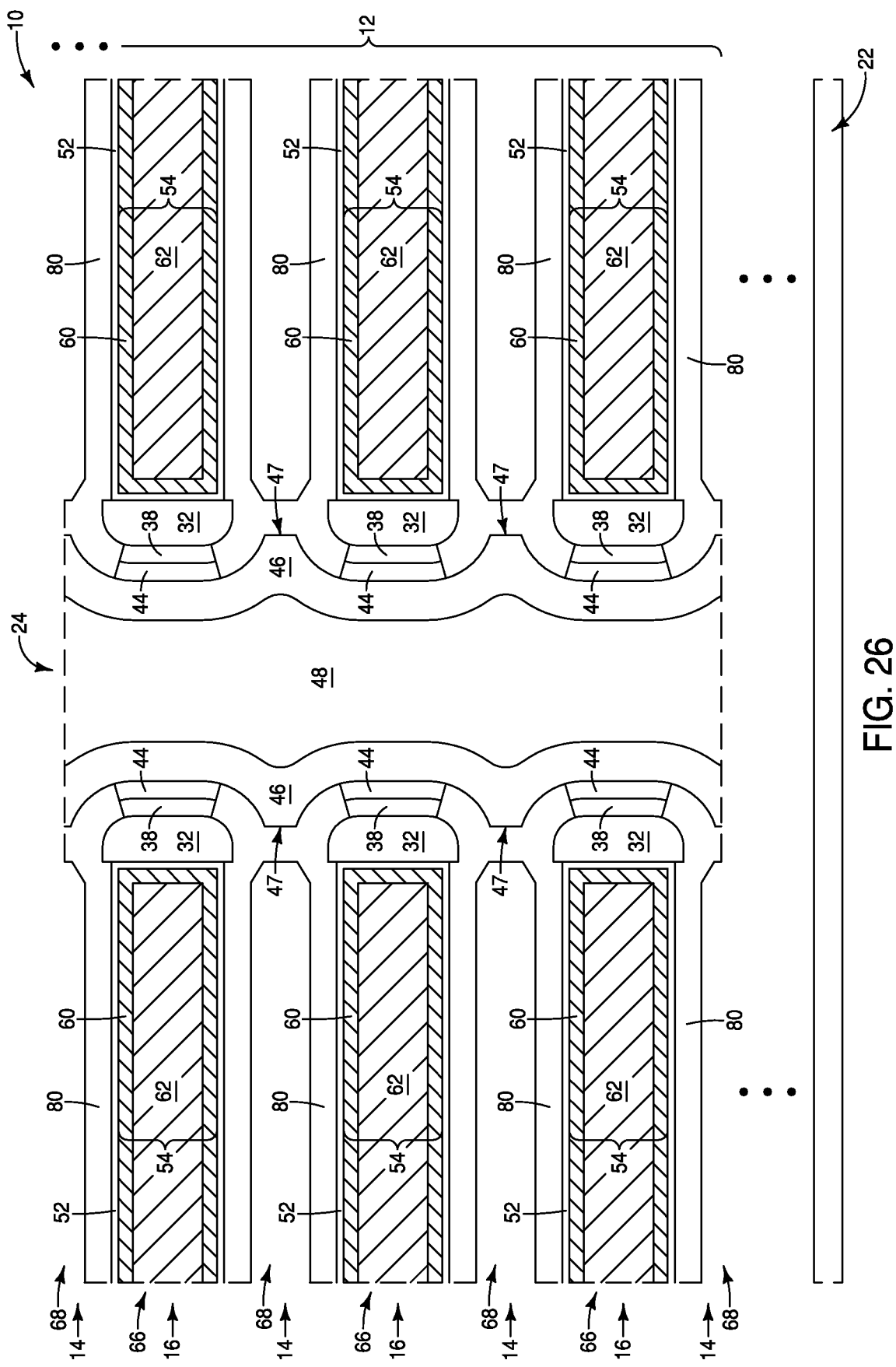

Referring to FIG. 26, the voids 68 are lined with doped semiconductor material 80. The semiconductor material 80 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some example embodiments, the semiconductor material 80 may comprise, consist essentially of, or consist of germanium.

The dopant within the doped semiconductor material 80 may be any suitable dopant; and may be n-type dopant or p-type dopant. In some embodiments, the channel material 46 will be doped to a first dopant type (n-type or p-type), and the dopant within the doped semiconductor material 80 will be an opposite type to the dopant within the channel material 46 (e.g., will be n-type if the channel material is p-type). In other embodiments, the dopant within the doped semiconductor material 80 may be a same type as the dopant type of the channel material 46. In some embodiments, the dopant within the doped semiconductor material 80 may comprise, consist essentially of, or consist of n-type dopant, such as, for example, phosphorus.

The doped semiconductor material 80 is directly against the surfaces 47 of the channel material 46 at the processing stage of FIG. 26.

Figure 27:
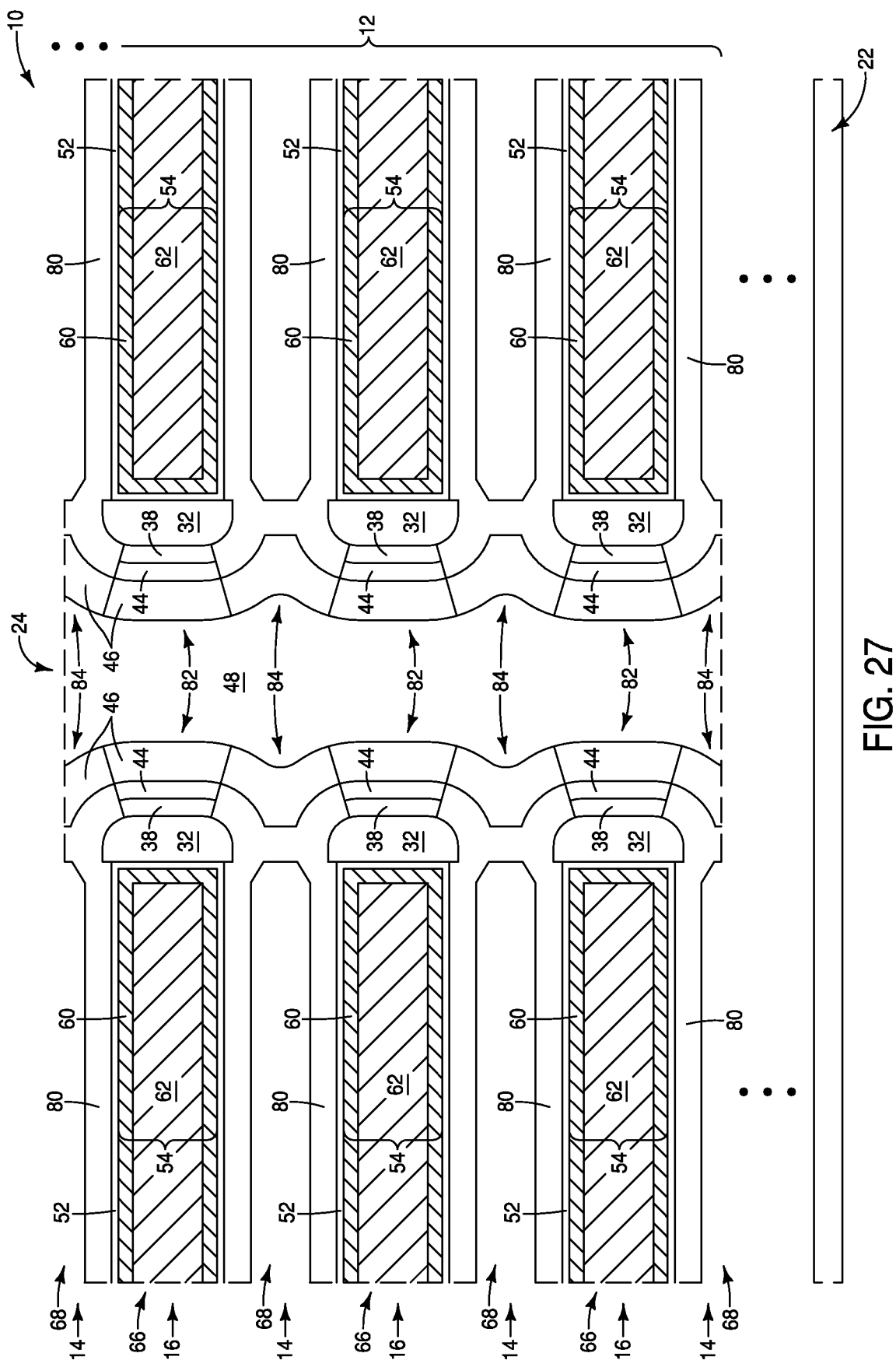

Referring to FIG. 27, dopant is diffused from the doped semiconductor material 80 into regions of the channel material 46 adjacent the doped semiconductor material 80 (i.e., adjacent the second voids 68). After the diffusion of the dopant into the channel material 46, the channel material comprises a semiconductor composition having first segments 82 and second segments 84. The first segments 82 alternate with the second segments 84 along a vertical direction of the stack 12. The first segments 82 are along (adjacent) the levels 16, and the second segments 84 are along (adjacent) the levels 14. The first segments 82 comprise the original dopant distribution of the channel material 46 (i.e., the dopant distribution present at the processing stage of FIG. 26), and the second segments 84 comprise a dopant distribution modified by diffusion of dopant from the doped material 80 into the channel material 46. Accordingly, the first segments 82 may be considered to have a first dopant distribution, and the second segments 84 may be considered to have a second dopant distribution which is different from the first dopant distribution. In some embodiments, the first segments 82 may be of opposite dopant type relative to the second segments 84 (e.g., the first segments 82 may be p-type while the second segments 84 are n-type, or vice versa). In other embodiments, the first and second segments 82 and 84 may comprise the same dopant type as one another, but the second segments 84 may have an enhanced dopant concentration due to the diffusion of additional dopant into such segments from the doped material 80.

The modification of the dopant distribution within the segments 84 as compared to the dopant distribution within the segments 82 may enable the channel material 46 to be tailored for specific applications. For instance, counter-doping the segments 84 may alleviate crosstalk between vertically-adjacent memory cells, and thereby improve data retention. As another example, enhancing the dopant concentration within the segments 84 may improve data transfer rates (i.e., process speed) along a memory string.

In some embodiments, the doped material 80 may comprise phosphorus, and the second segments 84 of the channel material 46 may comprise a higher concentration of phosphorus than do the first segments 82.

Figure 28:
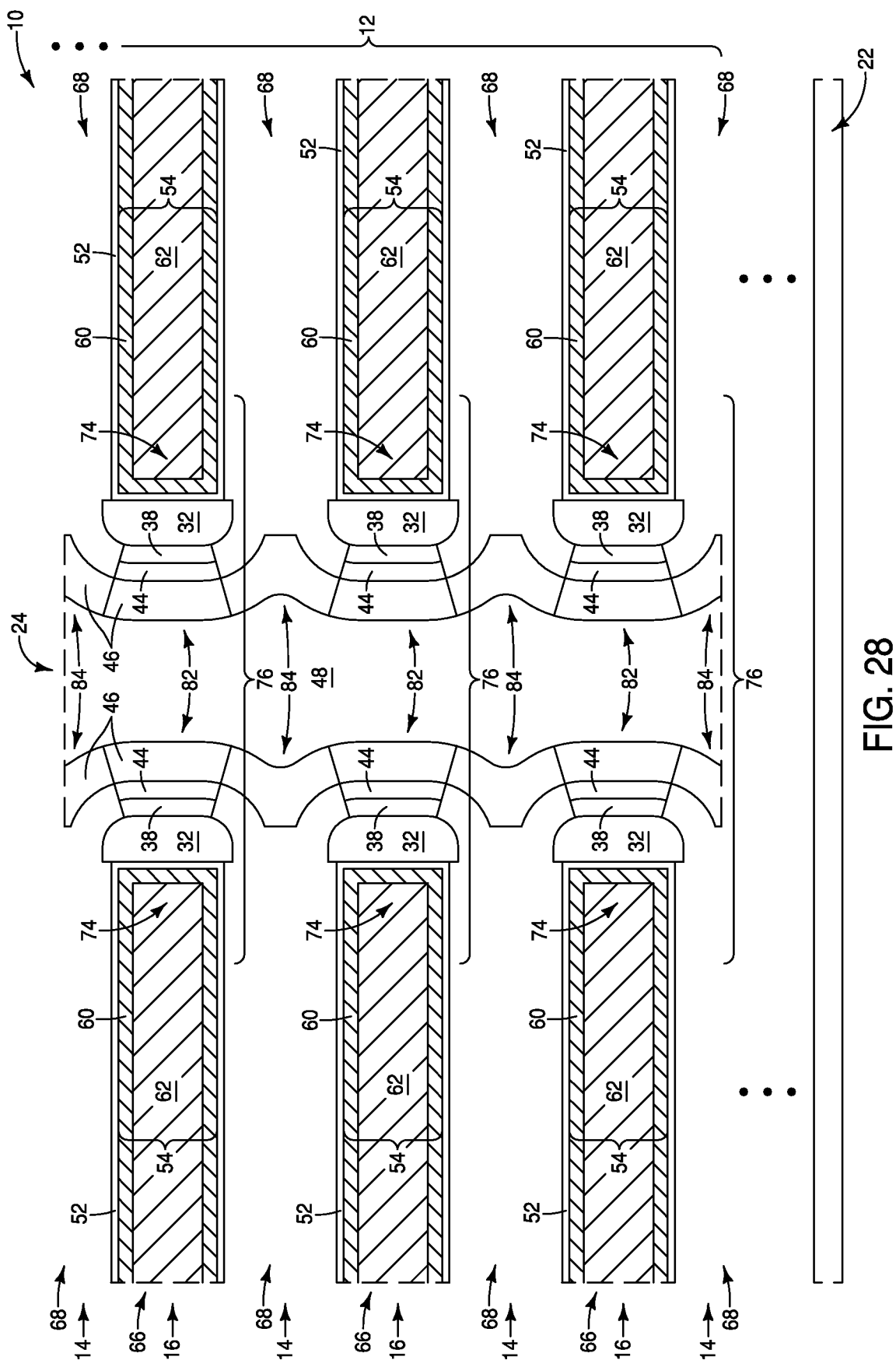

Referring to FIG. 28, the doped semiconductor material 80 (FIG. 27) is removed to leave a construction having a vertical stack 12 of insulative levels 14 and conductive levels 16. The conductive levels 16 comprise the conductive wordline material 54, and may be referred to as conductive wordline levels 66. The charge-blocking material 32 is adjacent the wordline levels 66, the charge-storage material 38 is adjacent the charge-blocking material, the charge-tunneling material 44 is adjacent the charge-storage material, and the channel material 46 extends vertically along with stack and is adjacent the charge-tunneling material.

The channel material 46 comprises a semiconductor composition. The semiconductor composition comprises first regions 82 (i.e., the segments 82) adjacent the wordline levels 16, and comprises second regions 84 (i.e., the segments 84) adjacent the insulative levels 14. The first and second regions 82 and 84 may be considered to have first and second chemical compositions, respectively; with the second chemical composition being different than the first chemical composition. In the illustrated embodiment, the difference between the first and second chemical configurations is a different dopant distribution in the first regions 82 than in the second regions 84. In some embodiments, the second regions 84 may have a higher concentration of n-type dopant (e.g., phosphorus) than the first regions 82. In some embodiments, the first and second regions 82 and 84 may be a same dopant type is one another (e.g., p-type or n-type), and the regions 84 may have an enhanced dopant concentration as compared to the regions 82. In other embodiments, the first and second regions 82 and 84 may be of opposite dopant types relative to one another (e.g., one may be n-type while the other is p-type).

The assembly 10 of FIG. 28 may be considered to include the wordline levels 16 alternating with the insulative levels 14 within the stack 12. The wordline levels may be considered to comprise the gate regions 74 proximate the charge-storage material 38, and spaced from such charge-storage material by the dielectric-barrier material 52 and the charge-blocking material 32. The gate regions 74, together with the materials 52, 32, 38, 44 and 46 form the NAND memory cells 76. The NAND memory cells are vertically stacked one atop another, and are along the wordline levels 16.

Figure 29:
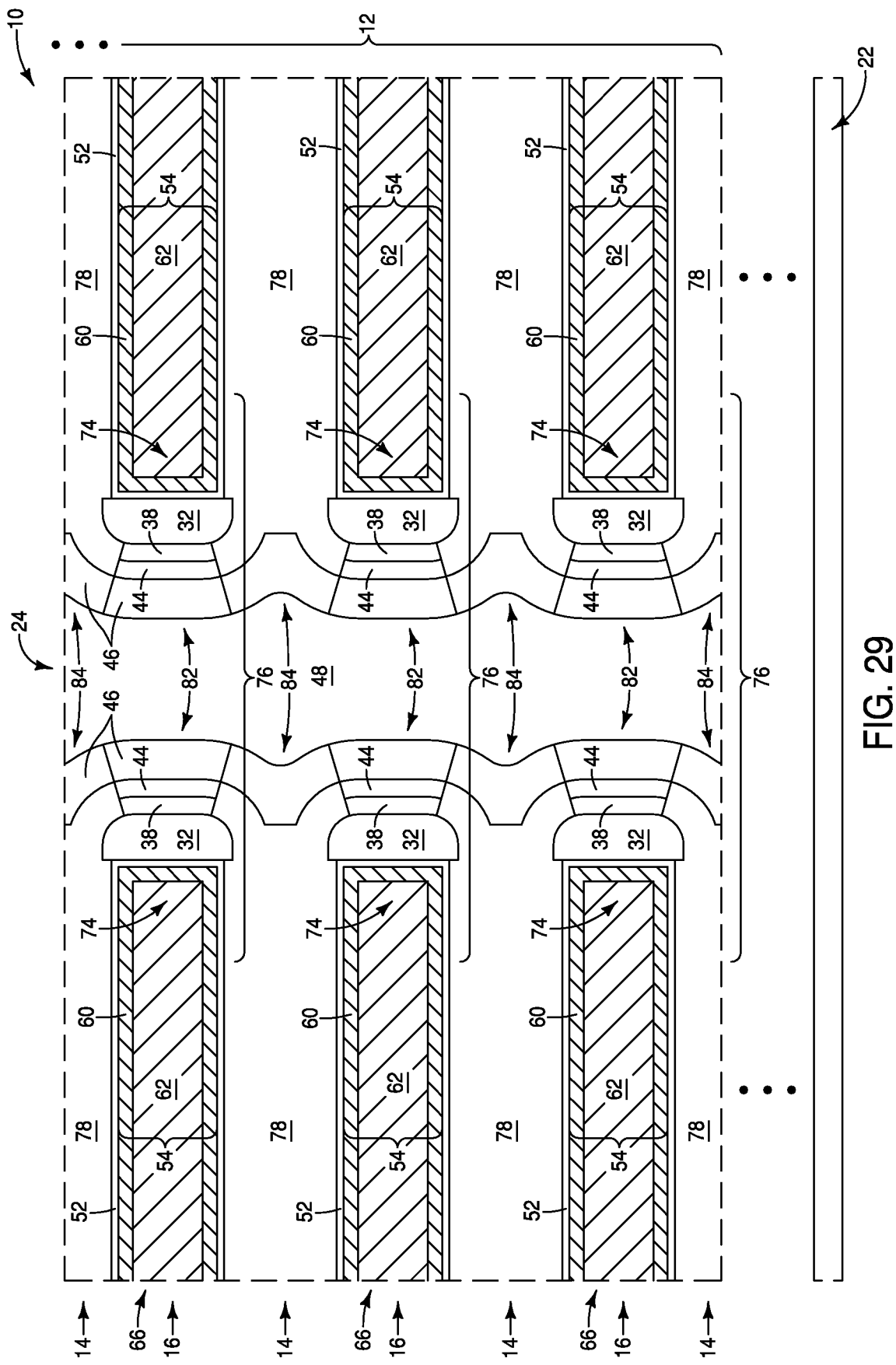

The voids 68 of FIG. 28 may remain along the insulative levels 14 in a finished memory array. Alternatively, the voids 68 may be at least partially filled with one or more insulative materials. FIG. 29 shows a processing stage which may follow that of FIG. 28 and in which the voids 68 are filled with the insulative material 78. Such insulative material may comprise any of the compositions described above relative to FIG. 15.

In some embodiments, the tightly-packed materials of the memory configurations described herein may enable such configurations to be scaled to reduced pitches as compared to conventional configurations.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory array which has a vertical stack of alternating insulative levels and wordline levels. A channel material extends vertically along the stack. The channel material includes a semiconductor composition and has first segments alternating with second segments. The first segments are adjacent the wordline levels and the second segments are adjacent the insulative levels. The first segments have a first dopant distribution and the second segments have a second dopant distribution which is different from the first dopant distribution.

Some embodiments include a memory array having a vertical stack of alternating insulative levels and wordline levels. A charge-blocking material is adjacent the wordline levels. A charge-storage material is adjacent the charge-blocking material. A charge-tunneling material is adjacent the charge-storage material. A channel material extends vertically along the stack and is adjacent the charge-tunneling material. The channel material comprises a semiconductor composition. The semiconductor composition has first regions adjacent the wordline levels and has second regions adjacent the insulative levels. The first regions have a first chemical configuration and the second regions have a second chemical configuration different from the first chemical configuration.

Some embodiments include a method of forming an integrated assembly. A vertical stack of alternating first and second levels is formed. The first levels comprise a first material and the second levels comprise a second material. An opening is formed to extend through the first and second levels. A third material is formed within the opening. The third material is formed selectively along the second levels relative to the first levels. The third material is configured as first segments which are vertically spaced from one another by first recesses. Charge-storage material is formed to extend vertically along the first and second levels. The charge-storage material has first regions along the third material and has second regions within the recesses. Charge-tunneling material is formed adjacent the charge-storage material and extends vertically along the first and second levels. Channel material is formed adjacent the charge-tunneling material and extends vertically along the first and second levels. The second material is removed to leave first voids. Conductive material is formed within the first voids. The conductive material comprises wordlines which extend within the second levels. The first material is removed to leave second voids. The second regions of the charge-storage material are exposed along edges of the second voids. The second regions of the charge-storage material are removed with etchant flowed into the second voids. After the second regions of the charge-storage material are removed, the first regions of the charge-storage material remain as second segments. The second segments are adjacent the second levels and are vertically spaced from one another by gaps adjacent the first levels.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a vertical stack of alternating first and second levels; the first levels comprising a first material and the second levels comprising a second material;
    forming an opening extending through the first and second levels;
    forming a third material within the opening; the third material being formed selectively along the second levels relative to the first levels; the third material being configured as first segments which are vertically spaced from one another by first recesses;
    forming charge-storage material to extend vertically along the first and second levels; the charge-storage material having first regions along the third material, and having second regions within the recesses;
    forming charge-tunneling material adjacent the charge-storage material and extending vertically along the first and second levels;
    forming channel material adjacent the charge-tunneling material and extending vertically along the first and second levels;
    removing the second material to leave first voids;
    forming a conductive material within the first voids, the conductive material comprising wordlines extending within the second levels;

removing the first material to leave second voids, the second regions of the charge-storage material being exposed along edges of the second voids; and removing the second regions of the charge-storage material with etchant flowed into the second voids; after the second regions of the charge-storage material are removed, the first regions of the charge-storage material remaining as second segments, said second segments being adjacent the second levels and being vertically spaced from one another by gaps adjacent the first levels.

2. The method of claim 1 wherein the first segments have substantially square corners.

3. The method of claim 1 wherein the first segments have substantially rounded corners.

4. The method of claim 1 wherein the first and third materials comprise silicon dioxide, and wherein the second material comprises silicon nitride.

5. The method of claim 4 wherein the third material is formed by:
selectively depositing liners of silicon nitride on the silicon nitride of the second material relative to the silicon dioxide of the first material; and
oxidizing the liners to form the third material.

6. The method of claim 5 wherein the first material consists of the silicon dioxide.

7. The method of claim 5 wherein the first material comprises the silicon dioxide doped with phosphorus.

8. The method of claim 7 wherein the first levels comprise the first material sandwiched between upper and lower films of additional material; and wherein the additional material consists of silicon dioxide.

9. The method of claim 1 further comprising filling the second voids with fourth material after removing the second regions of the charge-storage material.

10. The method of claim 9 wherein the fourth material comprises silicon dioxide.

11. The method of claim 1 further comprising:
lining the second voids with doped semiconductor material;
diffusing dopant from the doped semiconductor material into regions of the channel material adjacent the second voids.

12. The method of claim 11 further comprising removing the doped semiconductor material after the diffusing.

13. The method of claim 11 wherein the diffused dopant comprises an n-type dopant.

14. The method of claim 11 wherein the diffused dopant comprises phosphorus.

15. The method of claim 1 further comprising:
lining the second voids with doped germanium;
diffusing dopant from the doped germanium into regions of the channel material adjacent the second voids; and
after the diffusing, removing the doped germanium.

16. The method of claim 15 further comprising removing regions of the charge-tunneling material adjacent the second voids prior to lining the second voids with the doped germanium so that regions of the doped germanium are directly against the regions of the channel material.

17. The method of claim 15 wherein the channel material comprises silicon, and wherein the diffused dopant comprises phosphorus.

18. The method of claim 15 further comprising filling the second voids with fourth material after removing the doped germanium.

* * * * *